(12) United States Patent
Lell et al.

(10) Patent No.: US 9,559,496 B2
(45) Date of Patent: Jan. 31, 2017

(54) LASER LIGHT SOURCE

(71) Applicant: OSRAM OPTO SEMICONDUCTORS GMBH, Regensburg (DE)

(72) Inventors: Alfred Lell, Maxhuette-Haidhof (DE); Christoph Eichler, Tegernheim (DE); Wolfgang Schmid, Regensburg (DE); Soenke Tautz, Tegernheim (DE); Wolfgang Reill, Pentling (DE); Dimitri Dini, Soest (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/951,149

(22) Filed: Nov. 24, 2015

(65) Prior Publication Data
US 2016/0079733 A1    Mar. 17, 2016

Related U.S. Application Data

(62) Division of application No. 14/627,895, filed on Feb. 20, 2015, now Pat. No. 9,407,063, which is a division
(Continued)

(30) Foreign Application Priority Data

Dec. 21, 2007  (DE) .................. 10 2007 061 923
Mar. 6, 2008   (DE) .................. 10 2008 012 859

(51) Int. Cl.
*H01S 5/00*    (2006.01)
*H01S 5/10*    (2006.01)
(Continued)

(52) U.S. Cl.
CPC ........... *H01S 5/1082* (2013.01); *H01S 5/0078* (2013.01); *H01S 5/028* (2013.01); *H01S 5/0282* (2013.01);
(Continued)

(58) Field of Classification Search
CPC ...... H01S 5/0286; H01S 5/0282; H01S 5/028; H01S 5/22; H01S 5/1078; H01S 5/1082; H01S 5/1092; H01S 5/0078; H01S 5/105
(Continued)

(56) References Cited

U.S. PATENT DOCUMENTS 4,899,361 A   2/1990  Numai
5,923,690 A   7/1999  Kume et al.
(Continued)

FOREIGN PATENT DOCUMENTS

CN    1734987    2/2006
CN    1839522    9/2006
(Continued)

OTHER PUBLICATIONS

W. Streifer et al., "Reduction of Gas Diode Layer Spontaneous Emission", Applied Physics Letters, American Institute of Physics, Melville, N.Y., USA, vol. 37, No. 1, Jul. 1, 1980.
(Continued)

*Primary Examiner* — Kinam Park
(74) *Attorney, Agent, or Firm* — Cozen O'Connor

(57) ABSTRACT

A laser light source, comprising a semiconductor layer sequence having an active region and a radiation coupling out area having first and second partial regions, and a filter structure. The active region generates coherent first electromagnetic radiation and incoherent second electromagnetic radiation. The coherent first electromagnetic radiation is emitted by the first partial region along an emission direction, and the incoherent second electromagnetic radiation is
(Continued)

emitted by the first partial region and by the second partial region. The filter structure at least partly attenuates the incoherent second electromagnetic radiation emitted by the active region along the emission direction. The filter structure comprises at least one first filter element disposed downstream of the semiconductor layer sequence in the emission direction and it has at least one layer comprising a material that is non-transparent to electromagnetic radiation.

11 Claims, 13 Drawing Sheets

Related U.S. Application Data of application No. 13/730,363, filed on Dec. 28, 2012, now Pat. No. 8,964,808, which is a division of application No. 12/809,748, filed as application No. PCT/DE2008/002127 on Dec. 17, 2008, now Pat. No. 8,369,370.

(51) Int. Cl.
*H01S 5/028* (2006.01)
*H01S 5/22* (2006.01)

(52) U.S. Cl.
CPC ........... *H01S 5/1017* (2013.01); *H01S 5/1092* (2013.01); *H01S 5/22* (2013.01); *H01S 5/0286* (2013.01); *H01S 5/105* (2013.01); *H01S 5/1078* (2013.01); *H01S 2301/02* (2013.01); *H01S 2301/166* (2013.01)

(58) Field of Classification Search
USPC .............................. 372/49.01, 44.01, 43.01
See application file for complete search history.

(56) References Cited

U.S. PATENT DOCUMENTS

| | | | |
|---|---|---|---|
| 6,044,101 A | 3/2000 | Luft | |
| 6,791,257 B1 | 9/2004 | Sato et al. | |
| 7,103,082 B2 | 9/2006 | Sugimoto et al. | |
| 8,369,370 B2 | 2/2013 | Lell et al. | |
| 9,407,063 B2 | 8/2016 | Lell et al. | |
| 2003/0021327 A1 | 1/2003 | Murry | |
| 2003/0035360 A1 | 2/2003 | Shinotsuka et al. | |
| 2003/0165170 A1 | 9/2003 | Hatakoshi et al. | |
| 2003/0198065 A1 | 10/2003 | Hayashi et al. | |
| 2004/0105481 A1 | 6/2004 | Ishida et al. | |
| 2004/0213315 A1* | 10/2004 | Kume | B82Y 20/00 372/50.1 |
| 2005/0040410 A1 | 2/2005 | Ledentsov et al. | |
| 2005/0041715 A1 | 2/2005 | Kim | |
| 2005/0286583 A1 | 12/2005 | Guenter et al. | |
| 2006/0024063 A1 | 2/2006 | Onaka et al. | |
| 2006/0133442 A1* | 6/2006 | Kondou | B82Y 20/00 372/49.01 |
| 2006/0171440 A1 | 8/2006 | Ledentsov et al. | |
| 2006/0255152 A1 | 11/2006 | Xie et al. | |
| 2007/0081564 A1 | 4/2007 | Kuhnelt et al. | |
| 2007/0091964 A1 | 4/2007 | Lutgen | |
| 2007/0153867 A1 | 7/2007 | Muller | |
| 2007/0211772 A1 | 9/2007 | Romano et al. | |
| 2007/0278475 A1* | 12/2007 | Koda | H01S 5/0264 257/13 |
| 2016/0087404 A1 | 3/2016 | Lell et al. | |

FOREIGN PATENT DOCUMENTS

| | | |
|---|---|---|
| DE | 10 2005 056 949 | 4/2007 |
| DE | 10 2005 058 237 | 4/2007 |
| DE | 10 2006 010 728 | 6/2007 |
| EP | 1 508 946 | 2/2005 |
| JP | 55-043884 | 3/1980 |
| JP | S57-113643 | 7/1982 |
| JP | S61-172388 | 8/1986 |
| JP | 1-244431 | 9/1989 |
| JP | 2001-068784 | 3/2001 |
| JP | 2001-135885 | 5/2001 |
| JP | 2002-006595 | 1/2002 |
| JP | 2003-091875 | 3/2003 |
| JP | 2003-142780 | 5/2003 |
| JP | 2003-198065 | 7/2003 |
| JP | 2004-083653 | 3/2004 |
| JP | 2004-193556 | 7/2004 |
| JP | 2006-203162 | 8/2006 |
| JP | 2006-278458 | 10/2006 |
| JP | 2007-027207 | 2/2007 |
| JP | 2007-324313 | 12/2007 |
| WO | WO/9708793 | 3/1997 |
| WO | WO 2006/035388 | 4/2006 |
| WO | WO 2006/123580 | 11/2006 |
| WO | WO 2006/126567 | 11/2006 |

OTHER PUBLICATIONS

KREPS: "Suppression of side lobes in the far field of AlGAAs stripe lasers by a Te facet coating", Applied Optics, 1979.
Gidon, S., et al: "A Model of SuperRens Effect to Describe Future Generation Optical Data Storage" COMSOL Multiphysics User's Conference, 2005. (5 pages).
Hsu, W., et al.: "Blue-Laser Readout Properties of Super Resolution Near Field Structure Disc with Inorganic Write-Once Recording Layer" Japanese Journal of Applied Physics, vol. 42, Part 1, 2003, pp. 1005-1009.
Imanishi D., et al. "3W Operation of 643mm Wavelength Laser Diode Arrays with Index Guided Structure" 2002 IEEE 18th International Semiconductor Conference Digest, Sep. 29-Oct. 2002, pp. 131-132.
Kim, J., et al.: "Error Rate Reduction of Super-Rens Disc" Japanese Journal of Applied Physics, 43, 78, 2004. (2 pages).
Liu, Q., et al.: "Optical Properties of Metal-Oxide Films in Super-RENS" Japanese Journal of Applied Physics, vol. 44, No. 7A, 2005, pp. 5156-5163.
Shima, T., et al.: "Super-RENS Disk for Blue Laser System Retrieving Signals From Polycarbonate Substrate Side" Japanese Journal of Applied Physics, vol. 44, No. 5B, 2005, pp. 3631-3633.
Tominaga, J.: "Progress & Future Super-Resolution Near-Field Structure SuperRENS Optical Data Storage" National Institute of Advanced Industrial Science & Technology Aist, Center for Applied Near-Field Optics Research CAN-FOR, OSS-TBOC, Oct. 5, 2006. (7 pages).
Wikipedia, "Distributed Bragg Reflector", accessed Jun. 29, 2015, 3 pages.
Notice of Allowance dated Aug. 29, 2016 which issued in the copending U.S. Appl. No. 14/951,096.
Notice of Allowance dated Sep. 28, 2016 which issued in the copending U.S. Appl. No. 14/951,220.
Kerps: "Suppression of side lobes in the far field of AlGAAs stripe lasers by a Te facet coating", Applied Optics, 1979.

* cited by examiner

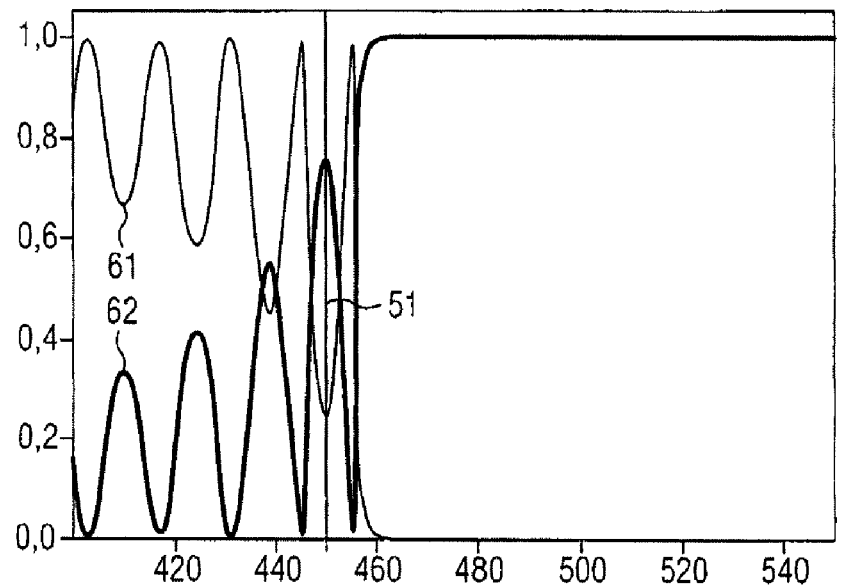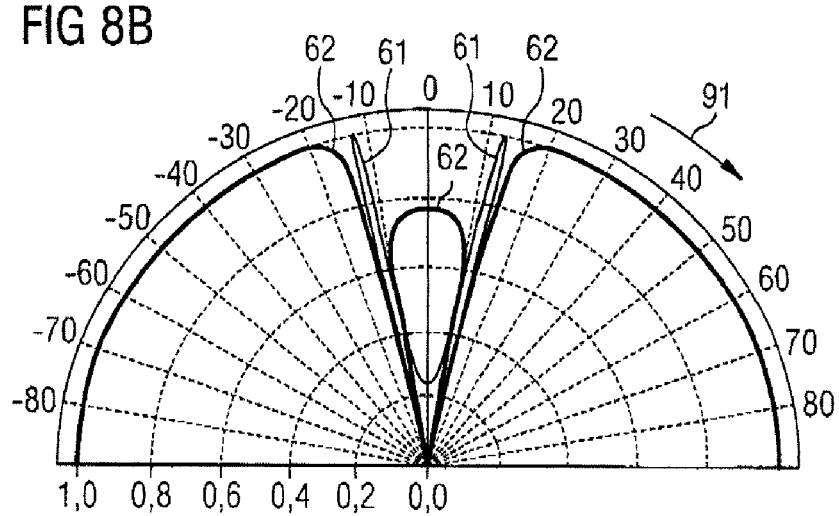

LASER LIGHT SOURCE

RELATED APPLICATIONS

This application is a divisional of U.S. patent application Ser. No. 14/627,895 filed Feb. 20, 2015 which is a divisional of U.S. application Ser. No. 13/730,363 filed Dec. 28, 2012 which is a divisional of U.S. application Ser. No. 12/809,748 filed Oct. 28, 2010 which claims priority under 35 USC §371 of PCT application No. PCT/DE2008/002127 filed on Dec. 17, 2008. Priority is also claimed of German patent application 10 2007 061 923.7 filed Dec. 21, 2007 and of German patent application 10 2008 012 859.7 filed Mar. 6, 2008, the disclosure contents of all of which are hereby incorporated by reference.

FIELD OF THE INVENTION

The present invention is related to a laser light source.

BACKGROUND OF THE INVENTION

Owing to technical progress in semiconductor lasers, numerous new applications will be made possible. Many of these applications require lasers that are operated in a transverse fundamental mode and that have an outstanding beam quality.

SUMMARY OF THE INVENTION

One object of at least one embodiment is to provide a laser light source having a semiconductor layer sequence.

This and other objects are attained in accordance with one aspect of the invention directed to a laser light source, comprising a semiconductor layer sequence having an active region and a radiation coupling out area having a first partial region and a second partial region different than the latter, and a filter structure, wherein the active region generates, during operation, coherent first electromagnetic radiation having a first wavelength range and incoherent second electromagnetic radiation having a second wavelength range, the coherent first electromagnetic radiation is emitted by the first partial region along an emission direction, the incoherent second electromagnetic radiation is emitted by the first partial region and by the second partial region, the second wavelength range comprises the first wavelength range, the filter structure at least partly attenuates the incoherent second electromagnetic radiation emitted by the active region along the emission direction, the filter structure comprises at least one first filter element disposed downstream of the semiconductor layer sequence in the emission direction, the at least one first filter element has at least one layer comprising a material that is non-transparent to electromagnetic radiation, and the non-transparent material is at least partly arranged on the second partial region.

In accordance with at least one embodiment, a laser light source comprises, in particular, a semiconductor layer sequence having an active region and a radiation coupling-out area having a first partial region and a second partial region different than the latter, and
a filter structure, wherein the active region generates, during operation, coherent first electromagnetic radiation having a first wavelength range and incoherent second electromagnetic radiation having a second wavelength range,
the second wavelength range comprises the first wavelength range,
the coherent first electromagnetic radiation is emitted by the first partial region along an emission direction,
the incoherent second electromagnetic radiation is emitted by the first partial region and by the second partial region, and
the filter structure at least partly attenuates the incoherent second electromagnetic radiation emitted by the active region along the emission direction.

Here and hereinafter, "light" or "electromagnetic radiation" can equally mean, in particular, electromagnetic radiation having at least one wavelength or a wavelength range from an infrared to ultraviolet wavelength range. In particular, the first and the second wavelength ranges can in this case comprise an ultraviolet and/or visible, that is to say a red to blue wavelength range having one or more wavelengths between approximately 350 nm and approximately 700 nm.

Thereby, the coherent first electromagnetic radiation can be characterized in particular by a first spectrum in the first wavelength range having a spectral width of less than 10 nm, and preferably less than 5 nm, and have a large coherence length. That can mean, in particular, that the coherent first electromagnetic radiation has a coherence length of an order of magnitude of meters up to an order of magnitude of a hundred meters or more. As a result, it can be possible that the coherent first electromagnetic radiation can be collimatable and/or focusable into a beam having little divergence and a small beam cross section. For this purpose, there can be disposed downstream of the radiation coupling-out area of the semiconductor layer sequence a collimation or focusing optical unit such as, for instance, an anamorphic lens, for instance a cylindrical lens, by means of which the coherent first electromagnetic radiation can be collimated and/or focused to form a radiation beam that can have a beam property similar to an ideal Gaussian radiation beam.

While the coherent first electromagnetic radiation can be generated in the active region during the operation of the laser light source by means of stimulated emission with a fixed phase relationship and a narrowly delimited solid angle range, the incoherent second electromagnetic radiation can be generated for example by means of spontaneous emission taking place simultaneously therewith. In contrast to electromagnetic radiation from stimulated emission, spontaneously emitted electromagnetic radiation has no direction dependence and can therefore be generated isotropically. As a result, the incoherent second electromagnetic radiation can be emitted in a larger angle range than the coherent first electromagnetic radiation from the radiation coupling-out area and can also be emitted from the second partial region of the radiation coupling-out area in addition to the emission from the first partial region. Furthermore, the second wavelength range of the incoherent second electromagnetic radiation has a larger spectral distribution than the first wavelength range of the coherent first electromagnetic radiation.

Therefore, the incoherent second electromagnetic radiation, in comparison with the coherent first electromagnetic radiation, has different imaging properties and has, in particular, lower focussability and/or collimatability. As a result, it can be possible that the beam quality of an electromagnetic radiation which comprises the coherent first electromagnetic radiation and the incoherent second electromagnetic radiation is considerably worsened in comparison with the beam quality of the coherent first electromagnetic radiation alone.

By way of example, in the case of laser projection applications, the incoherent second electromagnetic radiation can have an extremely disturbing effect for an external observer. In the case of laser projection applications, by way of example, a light spot generated by a laser light source can be moved over a surface region by means of one or more movable deflection mirrors and be modulated in terms of its intensity. If the light spot is moved over the entire surface region or 60 times per second, for example, a pictorial luminous impression for an external observer can be generated on the surface since the human eye can no longer temporally resolve the individual moving light spot and instead perceives the illuminated surface region. For multicolor projection applications it is also possible to use a plurality or laser light sources having different wavelength ranges, for instance a red, green and blue wavelength range, alongside one another. In order to achieve a sharpest possible representation and a high contrast during projection, the light spot should in this case preferably be formed only by the imaging of the coherent first electromagnetic radiation on the surface. Since the human eye has a high dynamic range with regard to the perception of light intensities, the incoherent second electromagnetic radiation can lead to a luminous impression with an unsharp imaging and a worsened contrast ratio.

By virtue of the fact that the laser light source described here comprises a filter structure that at least partly attenuates the incoherent second electromagnetic radiation emitted by the active region along the emission direction, it can be possible that the beam quality of the electromagnetic radiation emitted by the laser light source is significantly improved in comparison with conventional lasers, for example measurably in the form of the beam quality factor $M^2$ known to the person skilled in the art. In particular, the filter structure can be suitable for impeding, deflecting or absorbing the incoherent second electromagnetic radiation at the exit from the semiconductor layer sequence at least in the emission direction.

Furthermore, the laser light source described here can advantageously be usable for data storage or printing applications, for example, since, by virtue of the at least partial reduction of the incoherent second electromagnetic radiation in the emission direction, a higher resolution in comparison with conventional laser components can be made possible on account of the above-described improved focussability and/or collimatability of the electromagnetic radiation emitted by the laser light source. As a result, a higher storage density or printing resolution can be attainable, for example, in the case of these applications.

Furthermore, on account of the improved beam quality, it can be possible that simple, cost-effective and compact imaging optical units are usable in conjunction with the laser light source described here.

The coherent first electromagnetic radiation can have a first intensity and the incoherent second electromagnetic radiation can have a second intensity, wherein the first intensity can be at least two times, preferably at least ten times, and particularly preferably at least a hundred times, greater than the second intensity. Here and hereinafter, the intensity can mean the energy or the luminance of an electromagnetic radiation per unit area. In particular, the first and second intensities can denote intensities at the radiation coupling-out area.

The semiconductor layer sequence can be embodied as an epitaxial layer sequence or as a radiation-emitting semiconductor chip having an epitaxial layer sequence, that is to say as an epitaxially grown semiconductor layer sequence. In this case, the semiconductor layer sequence can be embodied on the basis of InGaAlN, for example. InGaAlN-based semiconductor chips and semiconductor layer sequences include, in particular, those in which the epitaxially produced semiconductor layer sequence generally has a layer sequence composed of different individual layers containing at least one individual layer which comprises a material from the III-V compound semiconductor material system $In_xAl_yGa_{1-x-y}N$ where $0 £ x £ 1$, $0 £ y £ 1$ and $x+y £ 1$. Semiconductor layer sequences having at least one active layer on the basis of InGaAlN can, for example, preferably emit electromagnetic radiation in an ultraviolet to green wavelength range.

As an alternative or in addition, the semiconductor layer sequence or the semiconductor chip can also be based on InGaAlP, that is to say that the semiconductor layer sequence can have different individual layers, at least one individual layer of which comprises a material from the III-V compound semiconductor material system $In_xAl_yGa_{1-x-y}P$ where $0 £ x £ 1$, $0 £ y £ 1$ and $x+y £ 1$. Semiconductor layer sequences or semiconductor chips having at least one active layer on the basis of InGaAlP can, for example, preferably emit electromagnetic radiation having one or more spectral components in a green to red wavelength range.

As an alternative or in addition, the semiconductor layer sequence or the semiconductor chip can also comprise other III-V compound semiconductor material systems, for example an AlGaAs-based material, or II-VI compound semiconductor material systems. In particular, an active layer comprising an AlGaAs-based material can be suitable for emitting electromagnetic radiation having one or more spectral components in a red to infrared wavelength range.

The semiconductor layer sequence can furthermore have a substrate, on which the abovementioned III-V or II-VI compound semiconductor material systems are deposited. In this case, the substrate can comprise a semiconductor material, for example a compound semiconductor material system mentioned above. In particular, the substrate can comprise sapphire, GaAs, GaP, GaN, InP, SiC, Si and/or Ge or be composed of such a material. In particular, the substrate can in this case be transparent to the coherent first electromagnetic radiation and the incoherent second electromagnetic radiation.

The semiconductor layer sequence can have as active region for example a conventional pn junction, a double heterostructure, a single quantum well structure (SQW structure) or a multiple quantum well structure (MQW structure). In the context of the application, the designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures. Alongside the active region, the semiconductor layer sequence can comprise further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and combinations thereof. Such structures concerning the active region or the further functional layers and regions are known to the person skilled in the art in particular with regard to construction, function and structure and will therefore not be explained in any greater detail at this juncture.

Furthermore, additional layers, for instance buffer layers, barrier layers and/or protective layers, can also be arranged perpendicularly to the growth direction of the semiconductor layer sequence around the semiconductor layer sequence, for example, that is to say on the side areas of the semiconductor layer sequence, for instance.

By way of example, the semiconductor layer sequence or the semiconductor chip can be an edge emitting laser diode. That can mean, in particular, that the radiation coupling-out area is formed by a side area of the semiconductor layer sequence or of the semiconductor chip, wherein the radiation coupling-out area can also comprise a side area of the substrate. Furthermore, the radiation exit area can for example also comprise a plurality of side areas. Preferably, the semiconductor layer sequence can in this case have a first and a second waveguide layer, between which the active region is arranged. In order to enable operation of the semiconductor layer sequence in a transverse fundamental mode, layers of the semiconductor layer sequence which are arranged on at least one side of the active region can be structured in ridge-type and/or trapezoidal fashion. Such configurations of the semiconductor layer sequence that are known as ridge waveguide, "ridge structure", "trapezoid structure" or "tapered structure" are known to the person skilled in the art and will not be explained any further here.

As an alternative, the semiconductor layer sequence or the semiconductor chip can also be a vertically emitting laser diode ("VCSEL"), such that the radiation coupling-out area can be formed by a main surface of the semiconductor layer sequence or of the semiconductor chip.

Furthermore, the laser light source can comprise a plurality of semiconductor layer sequences or semiconductor chips or one semiconductor layer sequence or one semiconductor chip having a plurality of active regions. In particular, the laser light source can also be embodied as a so-called broad stripe laser.

Furthermore, it can also be possible, for example, that an electromagnetic radiation is generated in a first active region, which radiation can generate the first electromagnetic radiation in a second active region by means of optical pumping, for example. Furthermore, the first radiation source can also have elements for example for frequency mixing or in particular for frequency doubling. Such elements can be integrated into the semiconductor layer sequence, applied on the semiconductor layer sequence or fitted externally with respect to the semiconductor layer sequence. In particular, the semiconductor layer sequence can have an optical resonator for the coherent first electromagnetic radiation. Said optical resonator can comprise, in particular, a first mirror as radiation coupling-out area or on the radiation coupling-out area and a second mirror on a surface of the semiconductor layer sequence which lies opposite the radiation coupling-out area, between which the active region is arranged. Furthermore, the semiconductor layer sequence can be embodied as a so-called "distributed feedback laser", DFB laser for short. DFB lasers of this type have an active region which is periodically structured in the emission direction. The periodically structured active region has periodically arranged regions having alternating refractive indices, which can form an interference grating or interference filter which can lead to wavelength-selective reflection. The resonator structures mentioned here are known to the person skilled in the art and will therefore not be explained any further.

The filter structure can have at least one first filter element disposed downstream of the semiconductor layer sequence in the emission direction. That can mean that the first filter element is applied or arranged on or above the radiation coupling-out area.

Here and hereinafter, the fact that one layer or one element is arranged or applied "on" or "above" another layer or another element or else "between" two other layers or elements can mean in this case that the one layer or the one element is arranged directly in direct mechanical and/or electrical contact on the other layer or the other element. Furthermore, it can also mean that the one layer or the one element is arranged indirectly on or above the other layer or the other element. In this case, further layers and/or elements can then be arranged between the one layer and the other layer.

Furthermore, the first filter element can be arranged on a resonator mirror as described above, or be embodied as part of a resonator mirror. As an alternative thereto, the first filter element can be arranged in a manner separated from the semiconductor layer sequence, and in particular in a manner separated and spaced apart from the radiation coupling-out area. By way of example, the laser light source can have a housing, in which the semiconductor layer sequence is arranged and which has a radiation coupling-out window that has the first filter element or is formed by the first filter element.

In particular, the first filter element can cover the first partial region and/or the second partial region of the radiation coupling-out area or be disposed downstream of at least one of said partial regions.

The at least one first filter element can have, for example, an angle-dependent and/or a wavelength-dependent transmissivity or transparency for electromagnetic radiation. In this case, it is possible, preferably, to define an emission angle, "angle" for short, relative to the emission direction of the coherent first electromagnetic radiation. An angle of 0° can therefore mean a direction parallel to the emission direction. An angle- and/or wavelength-dependent transmissivity can mean in this case that electromagnetic radiation is transmitted to different extents depending on the angle at which the electromagnetic radiation impinges on the first filter element, that is to say the angle of incidence, and/or depending on the wavelength. In particular, the angle- and/or wavelength-dependent transmission can be accompanied by an angle- and/or wavelength-dependent reflectivity and/or absorption of the first filter element. In this case, the known principle holds true that the sum of transmitted, reflected and absorbed intensity corresponds to the intensity of the electromagnetic radiation incident on the first filter element.

The angle-dependent transmissivity or transparency can decrease as the angle increases, for example. For an angle of 0°, the transmissivity or transparency can have a maximum value, for example, and, for an angle of greater than 0°, the transmissivity or transparency can have a value that is less than the maximum value. In this case, the maximum value at 0° can be a local or a global maximum of a function that characterizes the angle-dependent transmissivity.

Furthermore, as an alternative or in addition, the wavelength-dependent transmissivity or transparency can decrease with increasing deviation from the first wavelength range. That can mean that the at least one first filter element has a maximum transmissivity or transparency for the first wavelength range of the coherent first electromagnetic radiation and has a lower transmissivity or transparency for a wavelength range that is different than the first wavelength range. In this case, the maximum transmissivity can be a local or a global maximum of a function that characterizes the wavelength-dependent transmissivity.

As described above, the coherent first electromagnetic radiation can be emitted by the active region in a narrowly delimited angle range, while the incoherent second electromagnetic radiation can be emitted isotropically or with a Lambertian emission characteristic and hence in a large angle range, as a result of which, precisely in the far field of a laser light source without a filter structure, at relatively large angles, the incoherent second electromagnetic radiation can be perceptible and can lead to a worsening of the beam quality and of the luminous impression. By virtue of the first filter element having an angle-dependent transmissivity, it can be possible, in particular, that electromagnetic radiation which is emitted by the semiconductor layer sequence at an angle less than a limiting angle experiences less reflection and/or absorption and hence a greater transmissivity than electromagnetic radiation which is emitted at an angle greater than the limiting angle. In this case, the limiting angle can be less than or equal to 40°, preferably less than or equal to 30°, and particularly preferably less than or equal to 20°. The limiting angle can, in particular also correspond to a divergence angle of the coherent first electromagnetic radiation. Furthermore, the transmissivity of the first filter element at angles greater than the limiting angle can be less than or equal to 20%, preferably less than or equal to 10%, and particularly preferably less than or equal to 5%.

By way of example, the first filter element can have a Bragg mirror or be embodied as such a mirror. In this case, a Bragg mirror can have a plurality of layer pairs each having two layers having different refractive indices. In this case, the layers can each have a thickness of approximately one quarter of the optical path length of the coherent first electromagnetic radiation. In this case, suitable materials can be metal or semimetal oxides and/or metal or semimetal nitrides. A metal oxide or a semimetal oxide can comprise aluminum, silicon, titanium, zirconium, tantalum, niobium, or hafnium. Furthermore, a nitride can comprise at least one of the metals and semimetals mentioned, for example silicon nitride. Particularly preferably, the metal oxide or the semimetal oxide comprises at least one of the materials niobium pentoxide, hafnium dioxide, aluminum oxide, silicon dioxide, titanium dioxide, tantalum pentoxide and zirconium dioxide.

By virtue of a first filter element which has such a Bragg mirror or is embodied as such a mirror, through the choice of the material and the thickness of the layers and also the number of layer pairs, for instance greater than or equal to 5 and less than or equal to 20, it is possible to set the angle-dependent transmissivity as described above. On account of the angle-dependent transmissivity of the Bragg mirror, the incoherent second electromagnetic radiation which impinges on the first filter element at an angle greater than the limiting angle described above can be reflected back from said filter element in the direction of the semiconductor layer sequence, such that the incoherent second electromagnetic radiation emitted by the active region can be attenuated along the emission direction.

At the same time, the Bragg mirror can also have a wavelength-dependent transmissivity and/or a wave-length-dependent reflectivity. In this case, the reflectivity can be characterized in a manner dependent on the wavelength typically by a wavelength-dependent function having a global primary maximum and, in addition, a plurality of local secondary maxima. In particular, it can be advantageous if the Bragg mirror is embodied in such a way that a local secondary maximum of the wavelength-dependent reflectivity lies in the first wavelength range. The first wavelength range of the coherent first electromagnetic radiation can thus correspond for example to the wavelength range of a first local secondary maximum of the wavelength-dependent reflectivity, in particular to the first local secondary maximum on the short-wave side of the global primary maximum.

In addition or as an alternative to the first filter element, which can comprise or be a Bragg mirror or can be embodied in accordance with one of the other embodiments described further below, the filter structure can have at least one second filter element, which can be arranged or applied on a surface of the semiconductor layer sequence which lies opposite the radiation coupling-out area.

Thereby, the second filter element can have an angle-dependent transmissivity for electromagnetic radiation, wherein the transmissivity can increase with an increasing angle with respect to the emission direction. That can mean that the second filter element having the angle-dependent transmissivity can act, with regard to its transmissivity and/or reflectivity, in principle oppositely to the above-described first filter element having the angle-dependent transmissivity. By virtue of the second filter element having an angle-dependent transmissivity, it can be possible, in particular, that electromagnetic radiation which is emitted by the semiconductor layer sequence at an angle less than a limiting angle experiences greater reflection and hence a lower transmissivity than electromagnetic radiation which is emitted at an angle greater than the limiting angle. In this case, the limiting angle can be less than or equal to 40°, preferably less than or equal to 30°, and particularly preferably less than or equal to 20°. In particular, the transmissivity of the second filter element at angles greater than the limiting angle can be less than or equal to 20%, preferably less than or equal to 10%, and particularly preferably less than or equal to 5%. Furthermore, the reflectivity of the second filter element at angles of less than or equal to the limiting angle can be greater than 50%, preferably greater than 90%, and particularly preferably greater than 99%.

It can thus be possible that, by virtue of the second filter element, in particular the incoherent second electromagnetic radiation which impinges on the second filter element at angles greater than the limiting angle can be emitted through the second filter element and hence through the surface which lies opposite the radiation coupling-out area, while the coherent first electromagnetic radiation can be reflected back from the second filter element into the semiconductor layer sequence and hence in the emission direction.

As an alternative thereto, the second filter element can have an angle dependence like the first filter element, such that the incoherent second electromagnetic radiation is reflected at the second filter element and part of the coherent first electromagnetic radiation, for example less than 10%, and preferably less than 5%, and particularly preferably less than 1%, can be emitted through the second filter element. An embodiment of this type can be advantageous, for example, if there is disposed downstream of that surface of the semiconductor layer sequence which lies opposite the radiation coupling-out area a radiation detector, for instance a photodiode, by means of which the coherent first electromagnetic radiation emitted through the filter element is detected. The radiation detector can be for example an element in a power regulating arrangement for regulating the emission intensity of the laser light source. The second filter element can be advantageous for a high signal-to-noise ratio of the radiation detector signal.

In particular, the second filter element can be embodied as a Bragg mirror which is applied on the surface lying opposite the radiation coupling-out area and which can comprise at least one of the abovementioned materials for Bragg mirrors.

In the case of a first or second filter element having a Bragg mirror, the filter structure can also be embodied as part of the above-described resonator for the coherent first electromagnetic radiation. That can mean that the first and/or the second filter element(s) are/is part of a respective resonator mirror or else embodied in each case as a resonator mirror.

Furthermore, the first filter element can have a first filter element having a wavelength-dependent transmissivity, which element can be embodied as an etalon, for instance as a Fabry-Perot interferometer. The first filter element can furthermore have for example a glass plate having two plane-parallel main surfaces. The main surfaces can furthermore have a coating that increases or reduces the respective reflectivity, for instance composed of one of the abovementioned materials for Bragg mirrors. In particular, the etalon can be arranged on the radiation coupling-out area of the semiconductor layer sequence. As an alternative, it can be advantageous if the etalon is not arranged directly on the semiconductor layer sequence, but rather is embodied as a component separate from the semiconductor layer sequence. In this case, the etalon can preferably be embodied as part of a housing window or as a housing window.

The wavelength-dependent transmissivity of the etalon can be selectable through selection of the material and the thickness of the optical resonator and furthermore through selection of a coating on at least one of the main surfaces in such a way that the first wavelength range of the coherent first electromagnetic radiation corresponds to the wavelength range of a transmission maximum of the etalon. In this case, the etalon can be understood as an optical bandpass filter. By virtue of the fact that the second wavelength range of the incoherent second electromagnetic radiation comprises the first wavelength range, that is to say is larger than the first wavelength range, that part of the second wavelength range which goes beyond the first wavelength range can be at least partly attenuated by the etalon along the emission direction. In particular, the incoherent second electromagnetic radiation can be reflected by the etalon. In this case, it can be advantageous to arrange the etalon in the emission direction in such a way that the plane-parallel main surfaces of the etalon form an angle of less than 90° with the emission direction, since, by way of example, backreflections of the incoherent second electromagnetic radiation into the semiconductor layer sequence can thereby be prevented or at least reduced.

In particular, a first filter element having a Bragg mirror or an etalon can be combinable in combination with a semiconductor layer sequence having a DFB structure described above since the wavelength-selective properties of the DFB structure can easily be coordinated with those of the Bragg mirror and/or of the etalon. In this case, it can be advantageous, in particular, if the first filter element is arranged directly on the semiconductor layer sequence.

Furthermore, the first filter element can have an optical band edge filter, that is to say an optical high-pass or low-pass filter. Thereby, the limiting frequency of the optical band edge filter can be chosen in such a way that the coherent first electromagnetic radiation is transmitted preferably without attenuation through the first filter element, but that part of the second wavelength range of the incoherent second electromagnetic radiation which goes beyond the first wavelength range on the short- or long-wave side thereof is attenuated in the emission direction. In this case, the optical band edge filter can have a Bragg mirror or an absorptive color filter, for example. In addition, the optical band edge filter can have a saturation behavior as described further below.

The optical band edge filter can be arranged directly on the semiconductor layer sequence or be disposed as a separate component downstream of the semiconductor layer sequence in the emission direction. In the case of an absorptive band edge filter, in particular, an arrangement as a separate component makes it possible to avoid heating of the radiation coupling-out area of the semiconductor layer sequence, as a result of which the lifetime and the maximum output power of the semiconductor layer sequence can be increased. Furthermore, the first filter element can have a layer comprising a material that is non-transparent to electromagnetic radiation. In this case, the non-transparent material can comprise, for example, silicon, gallium, germanium, aluminum, chromium or titanium or a combination thereof. In this case, the one layer comprising the non-transparent material can be arranged at least partly on or above the second partial region of the radiation coupling-out area. In particular, the layer comprising the non-transparent material can be arranged on or above the entire second partial region. Furthermore, the non-transparent material can be applied on the radiation coupling-out area in a structured fashion such that the entire radiation coupling-out area apart from the first partial region is covered by the non-transparent material. For this purpose, the layer comprising the non-transparent material can have an opening above the first partial region of the radiation coupling-out area. By way of example, the layer can in this case be embodied as a pinhole diaphragm.

As a result, it can be possible that incoherent second electromagnetic radiation can no longer be emitted via the second partial region of the radiation coupling-out area. Thereby, the structured application of the layer comprising the non-transparent material can be possible, for example, by means of a thermal, electron- or ion-assisted application method, for instance vapor deposition, electron- or ion-assisted gas phase deposition or sputtering. In this case, the non-transparent material can be applied in a structured fashion by means of a mask, for example.

As an alternative to application by means of a mask, the layer comprising the non-transparent material can be applied in a large-area fashion on the first and second partial regions of the radiation coupling-out area by means of one of the methods mentioned above. In a suitable atmosphere, for instance an oxygen and/or nitrogen atmosphere, the layer can be converted photochemically in the first partial region. By way of example, the non-transparent material, which can comprise one of the abovementioned materials, for instance, can be converted photochemically into a transparent oxide, nitride or oxynitride depending on the atmosphere, by means of the action of light.

Thereby, the action of light can be effected for example by means of an external radiation source, for instance a laser, and furthermore for instance by means of structured illumination using a mask.

As an alternative or in addition, the action of light for the photochemical conversion can be effected by means of the coherent first electromagnetic radiation. For this purpose, in a method step A), the semiconductor layer sequence can be provided and, in a further step B), the layer comprising the non-transparent material can be applied, as described above, in a large-area fashion on the first and second partial regions of the radiation coupling-out area. Afterward, in a method step C), the semiconductor layer sequence can be activated in the oxygen and/or nitrogen atmosphere. As described above, the coherent first electromagnetic radiation can have an intensity many times higher than that of the incoherent second electromagnetic radiation. As a result, it can be possible that although the coherent first electromagnetic radiation can initiate a photochemical reaction in the layer comprising the non-transparent material to form a transparent oxide, nitride or oxynitride, the incoherent second electromagnetic radiation cannot initiate such a reaction. As a result, the photochemical reaction can be initiated precisely only in the first partial region, where the coherent first electromagnetic radiation is emitted from the radiation coupling-out area.

As an alternative or in addition to the photochemical reaction described above, a photothermal reaction can also be initiated in the non-transparent material, wherein the non-transparent material can be converted by means of an external radiation source or the coherent first electromagnetic radiation from the first partial region of the radiation coupling-out area by means of evaporation, for instance.

After the photochemical and/or photothermal reaction, the layer thus produced, which is non-transparent above the second partial region and transparent above the first partial region, in a further method step, can be coated with a further layer, for instance a passivation layer composed of a metal or semimetal oxide or nitride described further above in connection with the Bragg mirror. The layer comprising the non-transparent material can thereby be permanently protected.

The at least one first filter element can furthermore have an intensity-dependent transmissivity for electromagnetic radiation. As already described above, the coherent first electromagnetic radiation can have a first intensity that is greater than the second intensity of the incoherent second electromagnetic radiation. That can mean that the first filter element is non-transparent to electromagnetic radiation having an intensity greater than or equal to the second intensity. However, the first filter element can be transparent to electromagnetic radiation having an intensity that is equal to the first intensity. As a result, it can be possible that although the first filter element is transparent to the coherent first electromagnetic radiation, it is not transparent to the incoherent second electromagnetic radiation.

Thereby, the first filter element can be applied in a large-area fashion on the first and second partial regions of the radiation coupling-out area. As an alternative thereto, the first filter element can be disposed downstream of the semiconductor layer sequence in the emission direction as a separate component above the first and second partial regions. The first filter element can be applied on a resonator mirror, for example.

Furthermore, the intensity-dependent transmissivity of the first filter element can be characterized by the fact that the transmissivity increases as the intensity increases. In this case, the transparency can have a saturation behavior starting from a limiting intensity. That can mean that, starting from the limiting intensity, the transmissivity of the first filter element is no longer dependent of the intensity and the transmissivity of the first filter element has a maximum value at intensities greater than or equal to the limiting intensity. Preferably, the limiting intensity can in this case be greater than the second intensity and less than the first intensity.

By way of example, the first filter element can comprise a semiconductor material having a band gap that is smaller than the energy of the coherent first electromagnetic radiation. Thereby, the energy of an electromagnetic radiation having a wavelength range can denote the energy which corresponds to an average wavelength in the wavelength range.

Furthermore, the band gap can be smaller than the energy of the incoherent second electromagnetic radiation. By virtue of the fact that the band gap is smaller than the energy of the coherent first electromagnetic radiation and/or of the incoherent second electromagnetic radiation, it can be possible that the coherent first electromagnetic radiation and/or the incoherent second electromagnetic radiation can generate in the semiconductor material excited electron states as a result of absorption of the coherent first electromagnetic radiation and/or of the incoherent second electromagnetic radiation. Preferably, the energy released again upon de-excitation of the excited electron states is emitted as heat, for instance as lattice vibrations, in the semiconductor material.

The coherent first electromagnetic radiation and/or the incoherent second electromagnetic radiation can be attenuated by the absorption associated with the excitation of the electron states. Depending on the intensity incident on the semiconductor material and depending on the lifetime of the excited electron states, in the semiconductor material at a limiting intensity it is possible to attain a state in which the semiconductor material can no longer absorb incident electromagnetic radiation, such that the semiconductor material is then transparent. This behavior of the semiconductor material can also be referred to as saturation behavior.

Thereby, the transparent state can be dependent, in particular, on the intensity incident locally on the semiconductor material. That can mean that the first filter element can be transparent in at least one first filter region in which the intensity of the incident electromagnetic radiation is sufficient to bring about a transparent state and is hence greater than or equal to the limiting intensity. At the same time, the first filter element can still be absorbent in a second filter region, in which the intensity of the incident electromagnetic radiation lies below the limiting intensity, and can therefore be non-transparent or at least not fully transparent in this region.

In particular, the limiting intensity can therefore be set by means of the selection of the semiconductor material such that the second intensity is only just less than the limiting intensity, such that the first filter element is non-transparent above the second partial region of the radiation coupling-out area. In this case, the limiting intensity can be less than the first intensity, such that the first filter element is transparent above the first partial region of the radiation coupling-out area and coherent first electromagnetic radiation can be emitted through the first filter element.

Thereby, the difference between the band gap of the semiconductor material and the average energy of the incoherent second electromagnetic radiation can correspond to at least half the width of the second wavelength range. As a result, it can be possible that at least 80%, preferably at least 90%, and particularly preferably the whole, that is to say more than 99%, of the incoherent second electromagnetic radiation can be absorbed by the first filter element. In this case, the difference can be, for example, greater than or equal to 10 meV and less than or equal to 15 meV.

The setting of the intensity-dependent transmissivity and the limiting intensity can be effected, for example, by means of the thickness, the crystal quality and the selection of the semiconductor material. In this case, that proportion of an electromagnetic radiation which can be transmitted through the semiconductor material in the first filter element can be reciprocally exponentially dependent on the thickness of the semiconductor material or of a layer comprising the semiconductor material. In this case, the thickness can be selected for example in such a way that, with respect to an electromagnetic radiation which is incident on the first filter element with an intensity below the limiting intensity, that proportion of said radiation which is transmitted through the first filter element is less than or equal to $1/e$, and preferably less than or equal to $1/e^2$, where e is the Euler number.

The first filter element can comprise, for example, one or more materials from III-V semiconductor material systems such as, for instance, InAlGaAs, InGaAlP and InGaAlN, II-VI semiconductor material systems such as, for instance, ZnSe and ZnS or semiconductor materials such as, for instance Si and Ge. Furthermore, the semiconductor material can be doped with one or more of the materials C, Mg, Zn, Si, Te, Se, Fe, Cr and O.

The first filter element can have a layer comprising the semiconductor material, for example. Furthermore, the first filter element can have two dielectric layers, between which the layer comprising the semiconductor material is arranged. In this case, the embedding of the layer comprising the semiconductor material between the dielectric layers can be effected by means of the deposition of a layer sequence. In this case, the semiconductor material can form an epitaxially grown layer or else a multicrystalline or amorphous layer. The dielectric layers can comprise, for example, an oxide or nitride material mentioned in connection with the Bragg mirrors described above. As an alternative or in addition, the layer comprising the semiconductor material can comprise a matrix material, preferably a dielectric oxide or nitride material, into which the semiconductor material can be embedded in an amorphous fashion. By way of example, the layer comprising the semiconductor material can comprise SiN as matrix material, into which amorphous Si is embedded.

As an alternative or in addition to the semiconductor material, the first filter element can comprise a wavelength conversion substance suitable for converting the incoherent second electromagnetic radiation having the second wavelength range into electromagnetic radiation having a third wavelength range, which is different than the second spectrum. In this case, like the semiconductor material, the wavelength conversion substance can have a limiting intensity and a saturation behavior. The limiting intensity of the wavelength conversion substance can be set by means of the selection of the material and the thickness in such a way that the incoherent second electromagnetic radiation still cannot saturate the first filter element, while the first intensity of the coherent first electromagnetic radiation is greater than the limiting intensity, such that the first filter element is saturated above the first partial region of the radiation coupling-out area and therefore transparent to at least part of the coherent first electromagnetic radiation. In addition or as an alternative, the semiconductor material described above, upon the de-excitation of the excited electron states, can also emit an electromagnetic radiation having a third spectrum and thus act at least partly like a wavelength conversion substance.

Thereby, it can be advantageous if the third wavelength range lies in the infrared wavelength range, for example, and is thus no longer perceptible to the human eye. As an alternative or in addition, the filter structure can have a third filter element, which is disposed downstream of the first filter element and is non-transparent to the electromagnetic radiation having the third wavelength range. In this case, the third filter element can be, in particular, transparent to the coherent first electromagnetic radiation. By way of example, the third filter element can comprise an absorptive color filter.

The third filter element can be disposed for example as a separate component, for instance as a housing window or as part thereof, downstream of the first filter element in the emission direction. As a result, by way of example, the thermal load at the radiation coupling-out area can be reduced, as a result of which the lifetime of the semiconductor layer sequence can be increased.

The wavelength conversion substance can comprise one or more of the following materials: Garnets of the rare earths and the alkaline earth metals, for example $YAG:Ce^{3+}$, nitrides, nitridosilicates, siones, sialones, aluminates, oxides, halophosphates, orthosilicates, sulfides, vanadates and chlorosilicates. Furthermore, the wavelength conversion substance can additionally or alternatively comprise an organic material which can be selected from a group comprising perylenes, benzopyrenes, coumarins, rhodamins, and azo dyes. The wavelength conversion layer can comprise suitable mixtures and/or combinations of the wavelength conversion substances mentioned.

Furthermore, the first filter element can comprise a transparent matrix material which surrounds or contains the wavelength conversion substance or substances or which is chemically bonded to the wavelength conversion substance or substances. The transparent matrix material can comprise for example siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. By way of example, the matrix material can comprise or be an epoxy resin, polymethyl methacrylate (PMMA), polystyrene, polycarbonate, polyacrylate, polyurethane or a silicone resin such as, for instance, polysiloxane or mixtures thereof.

On account of the first intensity of the coherent first electromagnetic radiation, a first temperature can be generated in a first filter region of the first filter element, while in a second filter region of the first filter element a second temperature can be generated on account of the second intensity of the incoherent second electromagnetic radiation. Since the second intensity can be lower than the first intensity, the second temperature can also be lower than the first temperature. That can mean that the first filter element can have a higher temperature in the first filter region, which can be arranged on or above the first partial region of the radiation coupling-out area, than in the second filter region, which can be arranged on or above the second partial region of the radiation coupling-out area.

The first filter element can furthermore have a temperature-dependent transmissivity for electromagnetic radiation. In this case, the first filter element can have a limiting temperature below which the first filter element is non-transparent. In particular, the limiting temperature can be greater than the second temperature and less than the first temperature. That can mean that the first filter element is transparent only in the first filter region, such that the incoherent second electromagnetic radiation emitted by the second partial region of the radiation coupling-out area cannot be emitted through the first filter element.

The first filter element can comprise a material, for example, of which the atomic or molecular short-range order can change depending on the temperature. By way of example, the first filter element can be embodied as a layer or layer stack which can have surface plasmon modes which, below the limiting temperature, can couple to the coherent first electromagnetic radiation and to the incoherent second electromagnetic radiation. In this case, the term plasmons can denote periodically oscillating density fluctuations of free charge carriers, for instance electrons, in the first filter element or a layer of the first filter element. In particular, surface plasmons in this case denote longitudinal charge carrier density oscillations which occur parallel to the extension plane of a surface of a layer of the first filter element at said surface. In this case, the surface plasmon modes can be dependent on the atomic or molecular short-range order of at least one layer in the first filter element. Thereby, surface plasmons can be generated in particular at that surface of the layer of the first filter element which faces the semiconductor layer sequence. As a result of the coupling of electromagnetic radiation to surface plasmons in the first filter element, which can also be referred to as surface plasmon resonance, energy of the electromagnetic radiation can be transferred to the first filter element, such that at least part of the energy of the electromagnetic radiation can be absorbed. The first filter element can thereby be heated in the region in which electromagnetic radiation is incident on the first filter element.

As long as the temperature in a filter region of the first filter element remains below the limiting temperature, surface plasmon modes can be present in this filter region in the first filter element, and an electromagnetic radiation can couple to said surface plasmon modes. As a result of the heating of the first filter element in at least one filter region at a temperature greater than or equal to the limiting temperature, the atomic or molecular short-range order of at least one layer of the first filter element can be altered in such a way that surface plasmon modes to which the electromagnetic radiation can couple are no longer present, such that the first filter element is transparent in the filter region. In this case, the change in the atomic or molecular short-range order can be attainable for example by means of a temperature-dependent density change and/or a phase change such as, for instance, microbubble formation in at least one layer of the first filter element.

The limiting temperature can be settable by means of the material of at least one layer of the first filter element. By way of example, the at least one layer can comprise a material from a group formed by antimony, silver, platinum, palladium and zinc. In particular, the first filter element can have a layer stack that can comprise at least one of the materials mentioned. For coherent first electromagnetic radiation and incoherent second electromagnetic radiation from a blue wavelength range, the first filter element can preferably have a layer comprising antimony with one or more of the materials N, Te, Ge, Ag and In, for example antimony nitride ($SbN_x$), SbTe, GeSbTe and/or AgInSbTe. Furthermore, the first filter element can have a layer stack comprising the materials mentioned in a layer arranged between two silicon nitride layers. As an alternative or in addition, the first filter element can also have a layer stack comprising a $ZnS$—$SiO_2$ layer between two $PtO_x$ layers. For a red first and second wavelength range, the first filter element can have, for example, a layer comprising $AgO_x$, $PtO_x$ and/or $PdO_x$. Layers or layer stacks of this type can also be referred to as "super-resolution near-field structure" (Super-RENS).

Furthermore, the filter structure can have a fourth filter element, which is arranged on an area of the semiconductor layer sequence, which can be, for instance, a surface of the semiconductor layer sequence. In this case, the surface with the fourth filter element can be different than the radiation coupling-out area and the surface which lies opposite the radiation coupling-out area. In particular, the fourth filter element can be arranged on an area having an extension direction parallel to the emission direction of the coherent first electromagnetic radiation. Such an area can be, for example, a side area of the semiconductor layer sequence which extends from the radiation coupling-out area to the surface which lies opposite the radiation coupling-out area.

Furthermore, the area can also be an interface of a layer of the semiconductor layer sequence, wherein the semiconductor layer sequence can have a plurality of layers, as described above. In particular, the area can in this case be an interface between two layers of the semiconductor layer sequence.

Thereby, the fourth filter element can have a layer comprising a non-transparent material. The non-transparent material can, in particular, also be a material which is absorbent for the incoherent second electromagnetic radiation. In this case, the layer comprising the non-transparent material can be applied for example on a surface of the substrate which is remote from the active region, or on a surface of the substrate which faces the active region. Furthermore, the layer comprising the non-transparent material can be applied on a surface of a waveguide layer which is remote from the active region, for example as a non-transparent cladding layer or as part thereof, between the active region and an electrical contact such as, for instance, an electrode or else between the active region and the substrate. Such arrangements of the fourth filter element can prevent or at least reduce propagation of the incoherent second electromagnetic radiation within the semiconductor layer sequence in particular in the direction of an electrode and/or in the direction of the substrate, which can be advantageous, in particular, in the case of a semiconductor layer sequence having a transparent substrate such as GaN, for instance. It is thereby possible to reduce propagation of the incoherent second electromagnetic radiation emitted in the emission direction via the second partial region of the radiation coupling-out area.

Thereby, the non-transparent, preferably absorbent, material can preferably be electrically conductive and comprise one of the materials silicon, gallium, germanium, aluminum, chromium or titanium or a combination.

As an alternative or in addition, the fourth filter element can comprise an electrode provided for making electrical contact with the semiconductor layer sequence. In this case, the electrode can comprise a poorly reflective and/or poorly transmissive and preferably absorbent material such as, for instance, chromium and/or titanium.

Furthermore, the fourth filter element can have a plurality of absorbent layers applied on a plurality of surfaces of the semiconductor layer sequence which are different than the radiation coupling-out area or at least different than the first partial region of the radiation coupling-out area.

Furthermore, the fourth filter element can have or comprise a surface structure. The surface structure can be, for example, a roughening and/or at least one depression in at least one surface of the semiconductor layer sequence, which is different than the radiation coupling-out area. In particular, the semiconductor layer sequence can have a growth direction in which the layers of the semiconductor layer sequence are grown one above another. The semiconductor layer sequence can therefore also have at least one surface arranged perpendicular to the growth direction. The surface can be, for example, a surface of the substrate or of an electrical contact layer, for instance of an electrode, which faces the active region or is remote from the latter.

By way of example, one or a plurality of layers of the semiconductor layer sequence, on a side of the active region which is remote from the substrate, can be embodied in ridge-type fashion in a ridge or trapezoid structure described above. The surface having the surface structure can then preferably be a surface which is laterally offset with respect to, adjacent to, and/or adjoins, the layers embodied in ridge-type fashion. In this surface, the surface structure can be arranged in a manner laterally offset with respect to the active region.

The surface structure can furthermore have a depth which is such that the surface structure embodied as a roughening or depression extends into the semiconductor layer sequence. That can mean that the surface structure extends into at least one layer or into a plurality of adjacent layers of the semiconductor layer sequence into the semiconductor layer sequence. Particularly preferably, the surface structure can project into the semiconductor layer sequence outside the active region.

By way of example, the surface structure can have a roughening or at least one depression which projects right into a waveguide layer of the semiconductor layer sequence in a manner laterally offset with respect to the active region. The surface structure can be arranged in a manner offset at least a hundred nanometers, preferably at least one micrometer, and particularly preferably up to micrometers, laterally from the active region and/or from a ridge or trapezoid structure.

By way of example, the surface structure can have a roughening having an average period of approximately one tenth of the first and/or second wavelength range and can have a depth into the semiconductor layer sequence such that that layer of the semiconductor layer sequence which comprises the active region is preferably not penetrated by the roughening. The roughening can be producible by dry- or wet-chemical etching, for example.

Furthermore, the surface structure can have at least one trench or a regular arrangement of depressions. The trench or the regular arrangement of depressions can have an extension direction parallel to the extension direction of the layers of the semiconductor layer sequence and can form, with the emission direction of the coherent first electromagnetic radiation, an angle which can be greater than or equal to 0° and less than or equal to 90°.

An angle of 0° can mean, in particular, that the at least one trench or the regular arrangement of depressions is oriented parallel to the emission direction and hence parallel to an extension direction of the active region. As an alternative or in addition, the fourth filter element can have at least one trench whose extension direction forms an angle of greater than 0° and less than 90°, preferably greater than or equal to 30° and less than or equal to 60°, and particularly preferably approximately 45°, with the emission direction. That can mean, in particular, that the trench approaches the active region in the direction of the emission direction.

Thereby, the trench or the regular arrangement of depressions can have a depth such that the trench or the depressions extend(s) into the semiconductor layer sequence as far as a distance of less than or equal to 200 nm above a waveguide layer of the semiconductor layer sequence. Furthermore, such a surface structure can also extend right into the waveguide layer or else right into the substrate from a surface of the semiconductor layer sequence which lies opposite the substrate.

Thereby, the trench or the depressions can have a cross section having side areas parallel to the growth direction of the semiconductor layer sequence or side areas beveled up to an angle of 45° with respect to the growth direction. That can mean that the trench or the depressions can have a U-shaped or V-shaped cross section. By virtue of beveled sidewalls, incoherent second electromagnetic radiation which propagates within the semiconductor layer sequence can be deflected and directed for example to an above-described layer comprising an absorbent material. The trench or the depressions can additionally also be at least partly coated or filled with one of the above-described absorbent materials or one of the super-RENS materials.

Particularly preferably, the surface structures described here can be arranged in pairs symmetrically with respect to a ridge or trapezoid structure on a surface adjacent to such a structure.

Furthermore, a plurality of trenches or regular arrangements of depressions can be arranged alongside one another in a manner running parallel to one another. In this case, the plurality of trenches or regular arrangements of depressions can have a distance of less than or equal to an average wavelength of the first and/or second wavelength range, and particularly preferably a distance of approximately one quarter of the average wavelength. By virtue of such a sequence of trenches or depressions, the surface structure can act similarly or identically to a one- or two-dimensional photonic crystal.

As a result of a ridge-type embodiment of a ridge or trapezoid structure in at least one or a plurality of layers of the semiconductor layer sequence, a refractive index jump of typically 0.001 to 0.01 can arise, such that the ridge-type structure can enable wave guiding. As a result of this and as a result of waveguide layers in the semiconductor layer sequence, the incoherent second electromagnetic radiation can be guided within the semiconductor layer sequence in the direction of the radiation coupling-out area. The fourth filter element described here makes it possible to effectively reduce or prevent such propagation of the incoherent second electromagnetic radiation within the semiconductor layer sequence in a direction parallel to the extension direction of the layers of the semiconductor layer sequence. As a result, it can be possible that the emission of the incoherent second electromagnetic radiation by the second partial region of the radiation coupling-out area can be reduced.

The filter structure can have one of the herein-described first, second, third and fourth filter elements alone. Furthermore, the filter structure can also have a plurality of the herein-described first, second, third and fourth filter elements in combination. It is precisely as a result of this that the desired filter property of the filter structure can be adapted to the emission characteristic and to the employed materials and embodiments of the semiconductor layer sequence. By way of example, the filter structure can also have one of the above-described first filter elements directly on the semiconductor layer sequence and another of the above-described first filter elements as part of a housing window disposed downstream of the semiconductor layer sequence in the emission direction. Furthermore, for instance, first and/or second and/or third filter elements for example in combination with fourth filter elements can also form the filter structure.

Further advantages and advantageous embodiments and developments of the invention will become apparent from the embodiments described below in conjunction with FIGS. 1A to 17.

BRIEF DESCRIPTION OF THE DRAWINGS

FIGS. 7A to 9B show wavelength- and angle-dependent transmissivities of first and second filter elements in accordance with further exemplary embodiments.

Figure 1A:
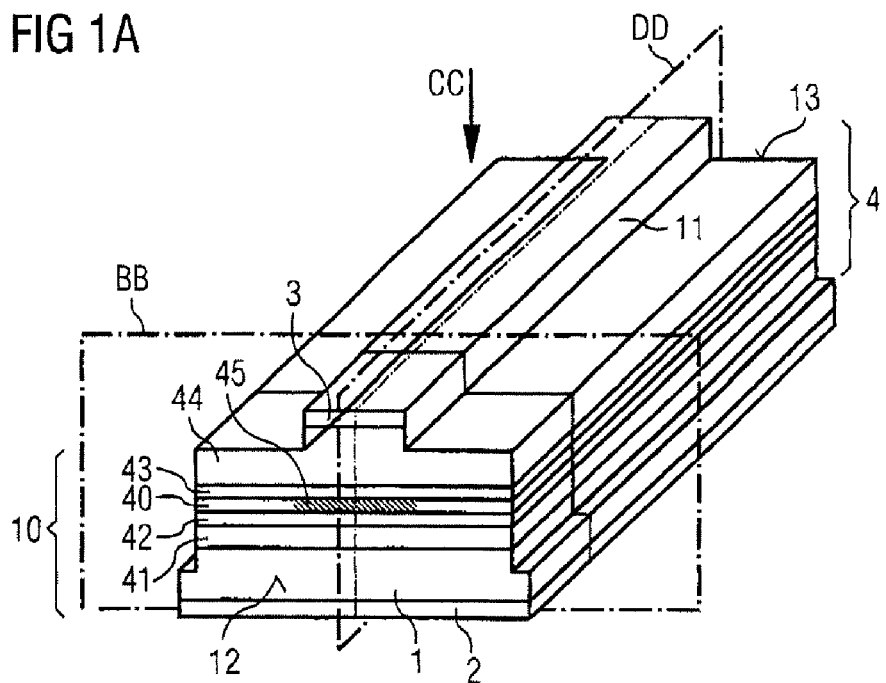
FIGS. 1A to 1F show schematic illustrations of a laser light source in accordance with one exemplary embodiment.

In the exemplary embodiments and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to allow better illustration and/or in order to afford a better understanding.

DETAILED DESCRIPTION OF THE DRAWINGS

In order to illustrate the considerations on which the laser light source described here is based, no filter structure 5 is shown in FIGS. 1A to 1F. However, the laser light source shown in these figures can have any filter structures 5 shown in the general part and in the further exemplary embodiments.

The laser light source has a semiconductor layer sequence 10 having a substrate 1, on which a plurality of functional layers 4 grown epitaxially are applied.

In the exemplary embodiment shown, the semiconductor layer sequence 10 is formed by a GaN substrate 1, on which are arranged a silicon-doped AlGaN cladding layer and thereabove a silicon-doped GAN waveguide layer 42. Thereabove, the semiconductor layer sequence 10 has an active layer having a multiple quantum well structure (MQW structure) having 1 to 5 GaInN quantum films and GaN barrier layers. A magnesium-doped GaN waveguide layer 43 and a magnesium-doped AlGaN cladding layer 44 are applied on the active layer. Furthermore, one or a plurality of contact layers composed, for example, of magnesium-doped GaN can additionally be applied on the cladding layer 44, while one or a plurality of intermediate layers can likewise be arranged between the substrate 1 and the cladding layer (not shown). On account of the material system described, the semiconductor layer sequence 10 is suitable for generating electromagnetic radiation in an ultraviolet to green, and preferably in a blue, wavelength range.

As an alternative to the nitride-based semiconductor materials described here, the semiconductor layer sequence 10 can, for example, also comprise phosphide- and arsenide-based semiconductor materials, thus by way of example a GaAs substrate 1 and thereabove a 100 nm thick intermediate layer 41 composed of AlGaAs having an Al proportion of approximately 40% of the group III materials and/or composed of InGaP having an In proportion of approximately 50% of the group III materials, thereabove a 2 µm thick InAlP wavelength layer 42, thereabove a 100 nm thick InGaAlP/InGaP quantum film/barrier layer MQW structure having an In proportion of approximately 50% and an Al proportion of approximately 25%, thereabove a 2 µm thick InAlP waveguide layer 43 and thereabove a 100 nm thick InGaP intermediate layer 44 and furthermore a 300 nm thick GaAs contact layer (not shown). A semiconductor layer sequence 10 of this type can be suitable for generating green to infrared electromagnetic radiation, and particularly preferably electromagnetic radiation in a red wavelength range.

Thereby, the substrate 1 can be a growth substrate on which the functional layers are grown epitaxially. As an alternative thereto, the semiconductor layer sequence can be producible using thin-film technology. That means that the functional layers are grown on a growth substrate and subsequently transferred to a carrier substrate, which then forms the substrate 1 of the semiconductor layer sequence 10. Depending on the growth technique, in this case the n-conducting layers or the p-conducting layers of the semiconductor layer sequence 10 can face the substrate 1. FIG. 1D furthermore indicates, by means of the dashed line 93, the extension plane of the functional layers 4 of the semiconductor layer sequence 10, which is perpendicular to the growth direction of the functional layers 4.

The electrical contact-connection of the semiconductor layer sequence 10 is effected via an electrode 2 on that surface of the substrate 1 which is remote from the functional layers 4 and an electrode 3 on that surface of the functional layers 4 which lies opposite the substrate 1. Thereby, the electrodes 2 and 3 can each have one or more layers comprising Ag, Au, Sn, Ti, Pt, Pd, Cr, Ni and/or Ge.

Figure 1B:
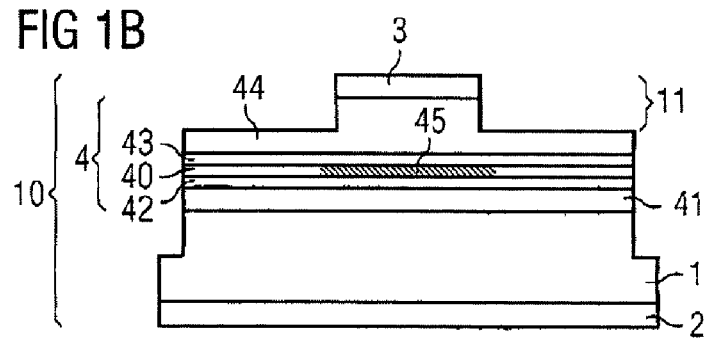
Figures 1, 1B:
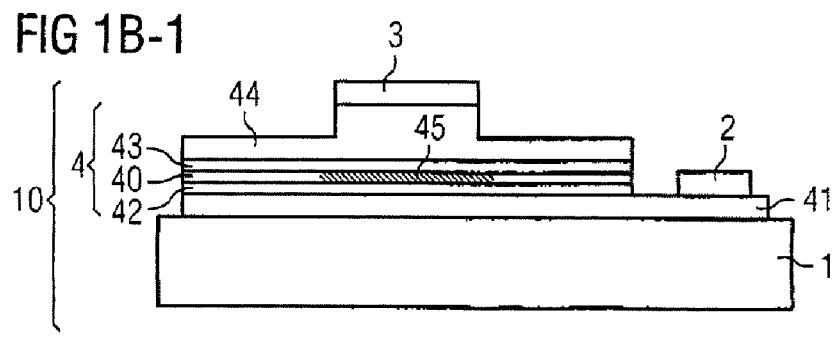
Figure 1C:
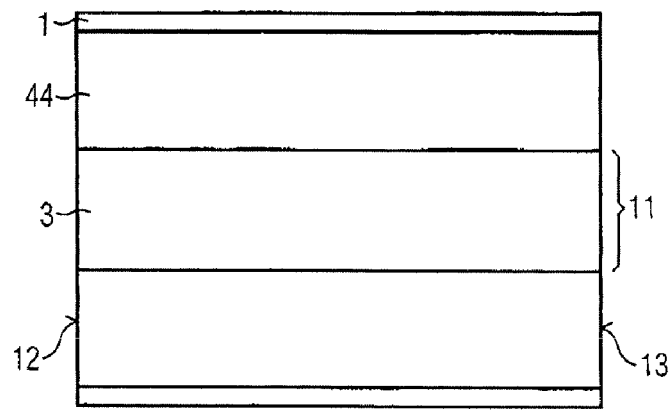
Figure 1D:
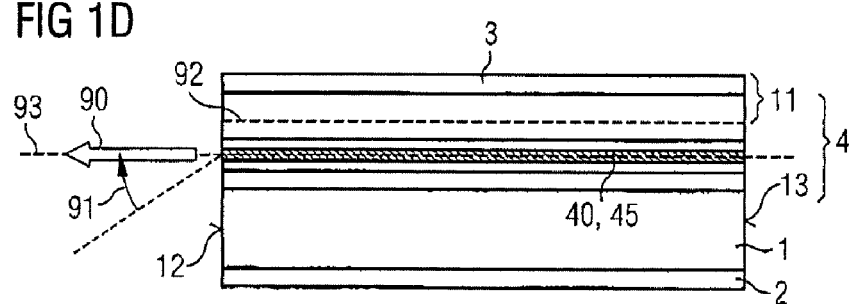

As an alternative to the electrical contact-connection in accordance with FIGS. 1A, 1B and 1C to 1F through the substrate 1, the electrical contact 2 can also be arranged on the same side of the substrate 1 as the functional layers 4, as is indicated in FIG. 1B-1. This type of contact-connection is primarily suitable for making the electrical contact with the functional layers 4 from the substrate side if they are arranged on an electrically non-conductive substrate 1. All the exemplary embodiments described below are also equally applicable to a laser light source having the contact-connection embodiment shown in FIG. 1B-1.

Furthermore, the semiconductor layer sequence 10 has a radiation coupling-out area 12 and a surface 13 lying opposite the latter and embodied as a rear side, which in each case have a reflective coating (not shown). As a result, the radiation coupling-out area 12 and the rear side 13 form an optical resonator. The respective reflective coating can comprise, for example, a Bragg mirror layer sequence and/or reflective metal layers.

On or above the surfaces of the semiconductor layer sequence which are different than the radiation coupling-out area, passivation layers for protecting the semiconductor layer sequence can furthermore be applied (not shown).

In the exemplary embodiment shown, the cladding layer 44 is applied partly in a ridge-type fashion and forms a so-called ridge structure 11 as described in the general part. As an alternative or in addition to the ridge structure 11 shown, the semiconductor layer sequence 10 can also have a trapezoid structure having a widening ridge 11. In FIG. 1D, the edge of the ridge structure 11 is indicated by the dashed line 92.

By virtue of the ridge structure 11, the formation of coherent first electromagnetic radiation 51 in a transverse fundamental mode can be made possible in the active layer 40, whereas undesired further laser modes can be suppressed. As a result, the active layer 40 has an active region 45, which, inter alia, is predefined by the width of the ridge structure 11 and is indicated by the hatched area in the active layer 40 in the exemplary embodiment shown. In this case, the active region 45 extends over the entire length of the active layer 40 in the resonator formed by the radiation coupling-out area 12 and the rear side 13. In the active region 45, the semiconductor layer sequence 10 can generate a coherent first electromagnetic radiation during operation by means of stimulated emission, which radiation can be emitted via a first partial region 121 of the radiation coupling-out area 12. By virtue of the resonator structure, the waveguide layers 42, 43 and the known mechanisms on which the stimulated emission is based, the coherent first electromagnetic radiation 51 is emitted along the emission direction 90 as a radiation beam or radiation lobe.

Figure 1E:
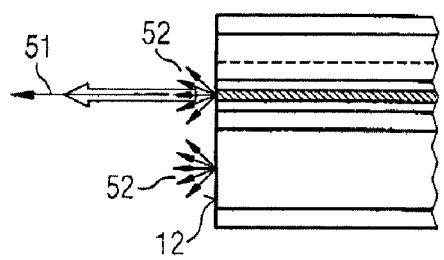
Figure 1F:
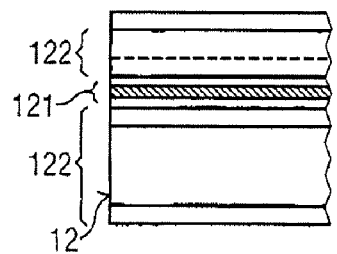

Furthermore, during the operation of the semiconductor layer sequence 10, alongside the coherent first electromagnetic radiation 51, incoherent second electromagnetic radiation 52 can also be generated. The latter can be generated for example by means of spontaneous emission in the active region 45, but also, for example, in the active layer 40 outside the active region 45 in marginal regions in which leakage currents are present during operation. Furthermore, spontaneous emission can also be excited by optical pumping from the reactive region or by scattering of electromagnetic radiation in particular at rough layer edges. As described in the general part, the incoherent second electromagnetic radiation 52 is generated isotropically. Through the waveguide layers 42, 43, the incoherent second electromagnetic radiation can likewise be guided to the first partial region 121 of the radiation coupling-out area 12 and be emitted by the first partial region 121. In addition, however, the incoherent second electromagnetic radiation can be directed to further partial regions of the radiation coupling-out area 12 for example as a result of scattering in the semiconductor layer sequence 10 and can be emitted by said further partial regions. Thus, via the radiation coupling-out area 12 outside the first partial region 121, the incoherent second electromagnetic radiation 52 can be emitted via a second partial region 122 comprising the regions of the radiation coupling-out area 12 which do not adjoin the active region 45 of the semiconductor layer sequence 10. This is indicated in FIGS. 1E and 1F, wherein FIG. 1E shows by way of example the emission of the incoherent second electromagnetic radiation 52 from a surface of the transparent substrate 1 which forms a part of the radiation coupling-out area 12 and hence of the second partial region 122. Emission of the incoherent second electromagnetic radiation 52 via a surface of the substrate 1 can be promoted by the refractive index profile in the semiconductor layer sequence 10 and the transparency of the substrate 1.

In this case, the incoherent second electromagnetic radiation 52 can be emitted in a wide angle range, as is indicated in FIG. 1E. Here and hereinafter, the emission angle for electromagnetic radiation from the radiation coupling-out area 12 is defined as the angle with respect to the emission direction 90, as is indicated in FIG. 1D.

The coherent first electromagnetic radiation 51 has a first intensity, which, depending on the energization of the semiconductor layer sequence 10, is approximately twice as large as up to more than 100 times greater than a second intensity of the incoherent second electromagnetic radiation 52.

Figure 2:
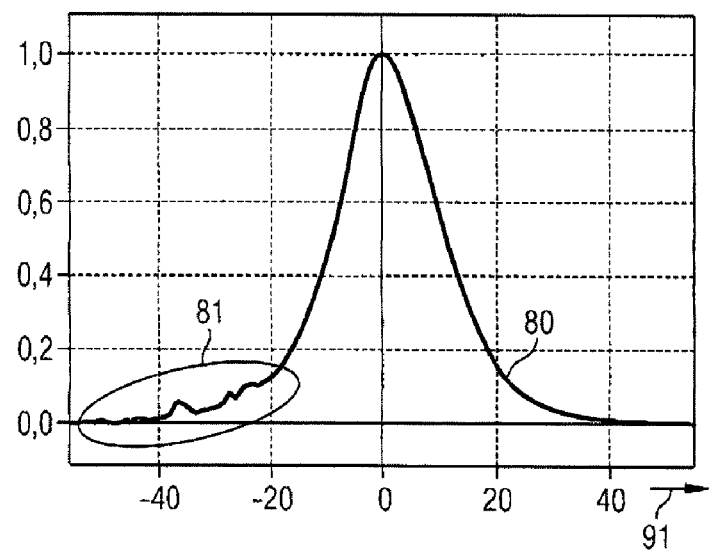
FIG. 2 shows an emission characteristic of a laser light source.

FIG. 2 shows the emission characteristic 80 for the laser light source from FIGS. 1A to 1F without the filter structure 5 described in the general part and in the further exemplary embodiments. In this case, the emission angle 91 in accordance with FIG. 1D in the sectional plane DD shown in FIG. 1A is plotted on the horizontal abscissa. The vertical ordinate shows arbitrary units for the intensity of the electromagnetic radiation emitted by the laser light source. In this case, the peak around 0° corresponds substantially to a Gaussian or at least Gauss-like beam profile of the coherent first electromagnetic radiation 51. For angles 91 less than or equal to approximately −20°, in the range designated by 81, incoherent second electromagnetic radiation 52 is additionally measurable, which significantly worsens the beam profile of the coherent first electromagnetic radiation 51. In this case, the emission characteristic 80 corresponds to the typical emission characteristic of known laser components.

The undesired coupling-out of incoherent second electromagnetic radiation 52 has the effect that secondary peaks arise in the vertical and also in the horizontal far field of the laser light source, which secondary peaks can be manifested in a significant worsening of the beam quality and can be an appreciable disturbance in projection, data memory or printing applications, for example.

By means of the filter structures 5 described in the general part and in the following exemplary embodiments, the emission characteristic of the laser light source described here can be substantially and significantly improved. In this case, the descriptions of the following exemplary embodiments are restricted to the extensions and/or modifications of the laser light source in accordance with FIGS. 1A to 1F. Without restriction, purely by way of example for the following exemplary embodiments, a coherent first electromagnetic radiation and an incoherent second electromagnetic radiation having a first and respectively second wavelength range having an average wavelength of approximately 450 nm are assumed. The coherent first electromagnetic radiation and the incoherent second electromagnetic radiation thus have in each case a blue wavelength range purely by way of example in the following exemplary embodiments.

Figure 3A:
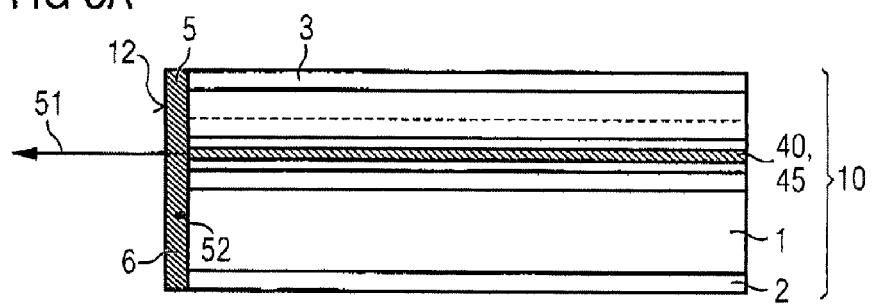
FIGS. 3A to 6 show schematic illustrations of laser light sources in accordance with further exemplary embodiments.

FIG. 3A shows an exemplary embodiment of a laser light source comprising a filter structure 5. In this case, the filter structure 5 has a first filter element 6, which is applied in a large-area fashion directly on the entire radiation coupling-out area 12 and thus in particular on the first and second partial regions 121 and 122 in accordance with FIG. 1F.

Thereby, the first filter element 5 has a layer stack comprising an antimony-containing layer between two silicon nitride layers. As described in the general part, such a layer stack has a temperature-dependent transmissivity for electromagnetic radiation since, by means of a temperature-dependent atomic and/or molecular short-range order for instance by means of surface plasmon resonances electromagnetic radiation below a limiting temperature of the first filter element and hence a limiting intensity of an electromagnetic radiation to be non-transparent to electromagnetic radiation. In this case, the first filter element 6 is embodied in such a way that the second intensity of the incoherent second electromagnetic radiation 52 can heat the first filter element 6 only to a temperature below the limiting temperature. As indicated in FIG. 3A, the incoherent second electromagnetic radiation 52 is therefore not transmitted by the first filter element 6. The first intensity of the coherent first electromagnetic radiation 51 is sufficient, however, to heat the first filter element 6 in the filter region above the first partial region 121 (see FIG. 1F) to a temperature above the limiting temperature. As a result, the first filter element is transparent only in this filter region, such that the coherent first electromagnetic radiation 51 can be emitted by the laser light source without incoherent second electromagnetic radiation being able to be emitted from the second partial region by the laser light source in the emission direction.

As an alternative or in addition, the first filter element 6 can also comprise a saturable semiconductor material having an intensity-dependent transmissivity for electromagnetic radiation, as described in the general part.

Figure 3B:
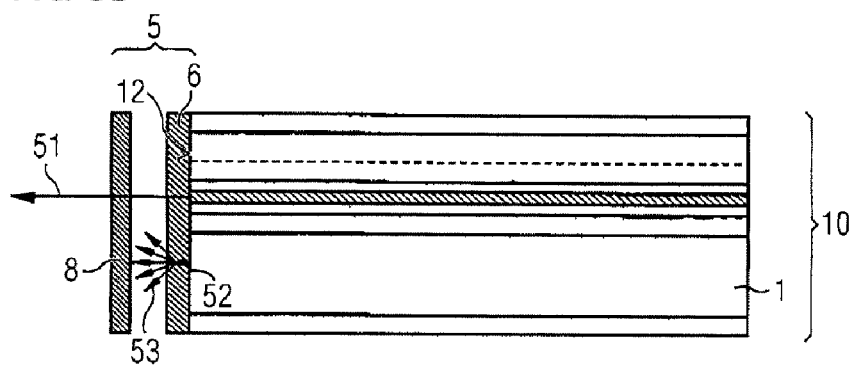

FIG. 3B shows a laser light source comprising a filter structure 5 having a first filter element 6 comprising a wavelength conversion substance. In this case, the wavelength conversion substance converts incoherent second electromagnetic radiation 52 into electromagnetic radiation having a third wavelength range 53. In this case, the third wavelength range comprises a red wavelength range. In this case, the first filter element comprising the wavelength conversion substance has an intensity-dependent saturation behavior, such that the coherent first electromagnetic radiation 51 can pass through the first filter element 6 apart from small conversion losses.

The filter structure 5 furthermore has a third filter element 8, which is disposed as a separate component downstream of the first filter element 6 in the emission direction and which comprises a color filter for red light. In this case, in the exemplary embodiment shown, the color filter for red light is an absorptive filter that is non-transparent in the red wavelength range. As a result, although the blue coherent first electromagnetic radiation 51 can be transmitted through the third filter element 8, the electromagnetic radiation having the third wavelength range 53 in a red wavelength range is absorbed by the third filter element 8 and can no longer be emitted by the laser light source. As a result, the emission of the incoherent second electromagnetic radiation can be reduced.

Figure 4:
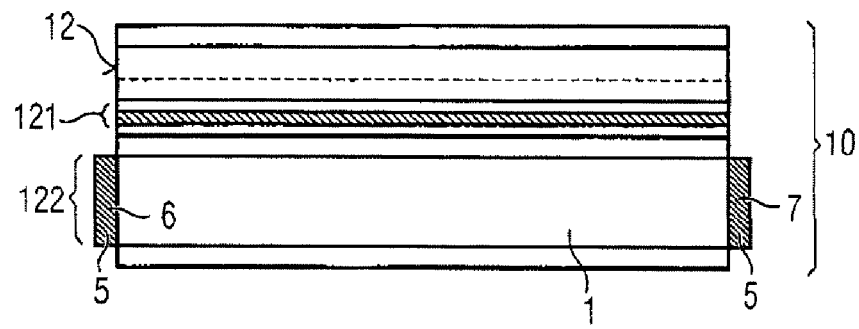

FIG. 4 shows a further exemplary embodiment of a laser light source comprising a filter structure 5. In this case, the filter structure 5 has a first filter element 6 on a surface of the substrate 1 which forms a part of the second partial region 122. For this purpose, the first filter element has an absorbent layer, which comprises silicon and is non-transparent to the incoherent second electromagnetic radiation 52. As a result, it is possible to prevent the emission of the incoherent second electromagnetic radiation 52 through that surface of the radiation coupling-out area 12 which is encompassed by the radiation coupling-out area 12.

Figure 5:
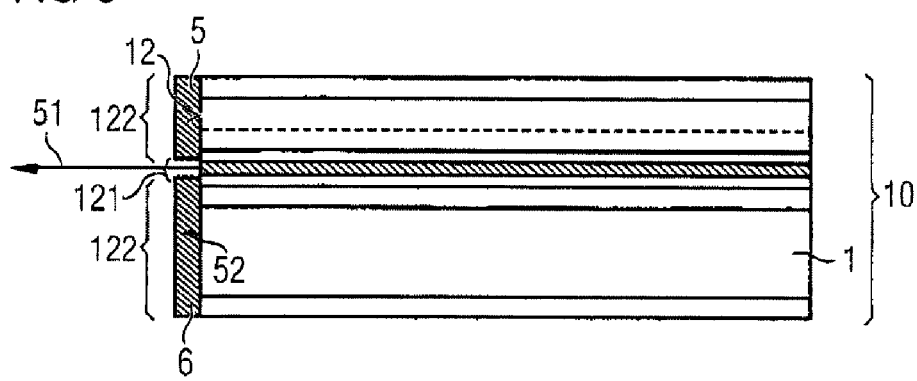

In addition, the filter structure 5 has a second filter element 7 on a surface of the substrate which lies opposite the radiation coupling-out area 12, said second filter element being embodied like the first filter element 6. In addition, the filter structure 5 can have further filter elements of this type on all further surfaces of the substrate perpendicular to the extension plane 93 of the layers of the semiconductor layer sequence 10 (see FIG. 1D). As a result, emission of the incoherent second electromagnetic radiation 52 from these surfaces can additionally be prevented. FIG. 5 shows a further exemplary embodiment of a laser light source comprising a filter structure 5, which, in contrast to the previous exemplary embodiment, has a first filter element 6 embodied as a pinhole diaphragm. In this case, the first filter element 6 is applied directly on the radiation coupling-out area 12 of the semiconductor layer sequence 10 and comprises a non-transparent material. In particular, in the exemplary embodiment shown, the non-transparent material can be a metal such as, for instance, chromium, aluminum and/or titanium.

The first filter element 6 has an opening arranged above the first partial region 121 of the radiation coupling-out area 12, such that the coherent first electromagnetic radiation 51 can be emitted by the semiconductor layer sequence 10. The entire second partial region 122, via which the incoherent second electromagnetic radiation 52 can be emitted, is covered with the non-transparent material. As a result, the emission of the incoherent second electromagnetic radiation 52 in the emission direction can be considerably minimized.

The first filter element 6 embodied as a pinhole diaphragm can be applied by vapor deposition of the metal layer through a mask, such that the opening is arranged above the first partial region 121. As an alternative thereto, the pinhole diaphragm can be producible by large-area application of the metal layer and subsequent photothermal evaporation of the non-transparent material above the first partial region 121. In particular, in this case, as explained in the general part, the coherent first electromagnetic radiation 51 of the semiconductor layer sequence 10 itself can be used.

As an alternative to a pinhole diaphragm having an opening as in the exemplary embodiment shown, the first filter element 6 can also have, above the first partial region 121, a transparent metal oxide or metal nitride or metal oxynitride layer, which, as described in the general part, is producible by means of a photochemical reaction of the metal layer applied in a large-area fashion beforehand.

Figure 6:
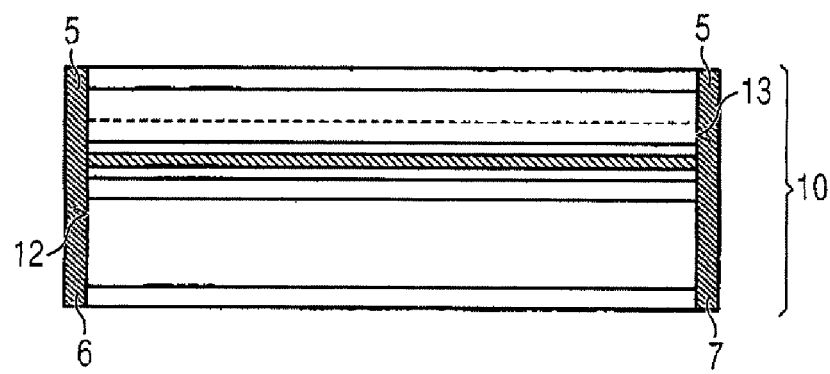

FIG. 6 shows a further exemplary embodiment of a laser light source, having a filter structure 5 having a first filter element 6 on the radiation coupling-out area 12 and a second filter element 7 on that surface of the semiconductor layer sequence 10 which lies opposite the radiation coupling-out area 12, that is to say the rear side 13. In this case, the filter elements 6 and 7 are each embodied as filter elements having a wavelength- and angle-dependent transmissivity in the form of Bragg mirrors. In particular, in the exemplary embodiment shown, the filter structure 5 is embodied as part of the optical resonator of the semiconductor layer sequence 10.

In this case, the first filter element 6 has a high reflectivity for incoherent second electromagnetic radiation emitted from radiation coupling-out area 12 at an angle 91 greater than a limiting angle. The second filter element 7, by contrast, has a low reflectivity for incoherent second electromagnetic radiation incident on the rear side 13 through the semiconductor layer sequence 10 at an angle greater than a limiting angle. In addition or as an alternative to a Bragg mirror, the first filter element 6 can also have an etalon.

FIGS. 7A to 9B show exemplary embodiments of suitable first and second filter elements 6, 7 embodied as Bragg mirrors. In this case, all the embodiments of first and second filter elements 6 and 7 that are shown in these exemplary embodiments are optimized purely by way of example for the abovementioned first and respectively second wavelength range around an average wavelength of approximately 450 nm. The average wavelength of the coherent first electromagnetic radiation 51 is marked by a vertical line indicated by 51 in FIGS. 7A, 7C, 8A and 9A. The wavelength-dependent transmissivities 61 and reflectivities 62 shown in FIGS. 7A, 7C, 8A and 9A correspond to an emission angle of 0°, that is to say along the emission direction in FIG. 1D. In this case, there is plotted on the horizontal abscissa the wavelength in nanometers and on the vertical ordinate the transmissivity and the reflectivity in arbitrary units in a normalized fashion. FIGS. 7B, 7D, 8B and 9B show angle-dependent transmissivities 61 and reflectivities 62 at this wavelength. In this case, respectively in polar coordinates, the angle-dependent transmissivity 61 and reflectivity 62 in arbitrary normalized units are plotted as radial coordinate and the emission angle 91 is plotted as angle coordinate from −90° to +90°.

Figure 7A:
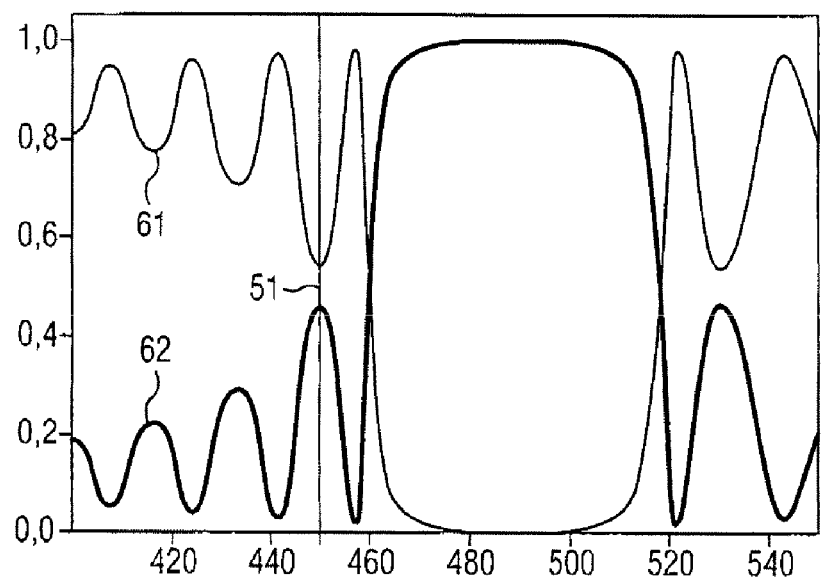
Figure 7B:
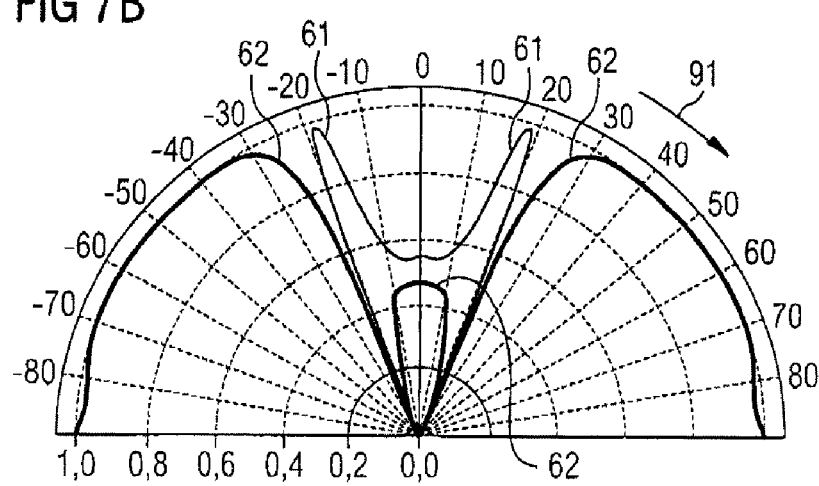

FIGS. 7A and 7B relate to a first filter element 6 having a Bragg mirror having 20 layer pairs. In this case, a layer pair comprises a first layer having a refractive index of $n_1=1.8$ and a thickness of $\lambda_D/4n_1$ and also a second layer having a refractive index $n_1=2.1$ and a thickness $\lambda_D/4n_2$, wherein $\lambda_D=487$ nm is the so-called design wavelength. In this case, in this and in the further exemplary embodiments, the first and second layers of the layer pairs can be formed from materials or material combinations as described above in the general part which have the corresponding refractive indices.

The Bragg mirror embodied in this way has a reflectivity of 46% in the emission direction, that is to say in the case of an emission angle of 0° for the average wavelength of 450 nm of the coherent first electromagnetic radiation. Above a limiting angle of approximately 30°, the Bragg mirror has a reflectivity of more than 95%, such that, in particular, incoherent second electromagnetic radiation emitted from the radiation coupling-out area at an angle 91 greater than or equal to the limiting angle cannot be transmitted by the first filter element 6. This likewise applies to angles that are less than or equal to the negative limiting angle.

The first filter element 6 is embodied in such a way that the first wavelength range of the coherent first electromagnetic radiation 51 corresponds to a first local secondary maximum on the short-wave side of the global primary maximum of the reflectivity 62. Since the reflectivity 62 is therefore lower in the emission direction for wavelengths in a range of approximately ±5 nm around the average wavelength of the coherent first electromagnetic radiation 51, the average wavelength of the coherent first electromagnetic radiation 51 preferably builds up oscillation in the active region 45 and the first filter element 6 can therefore also enable a wavelength stabilization of the coherent first electromagnetic radiation 51.

Figure 7C:
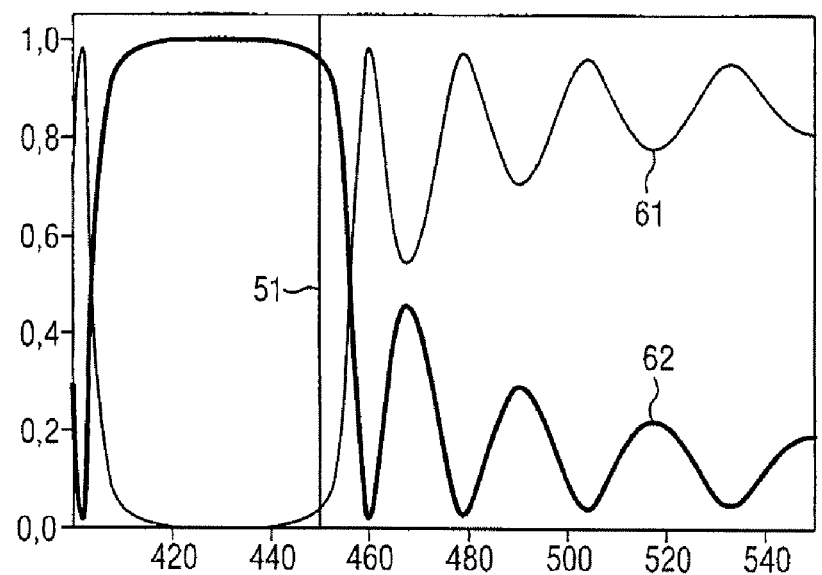
Figure 7D:
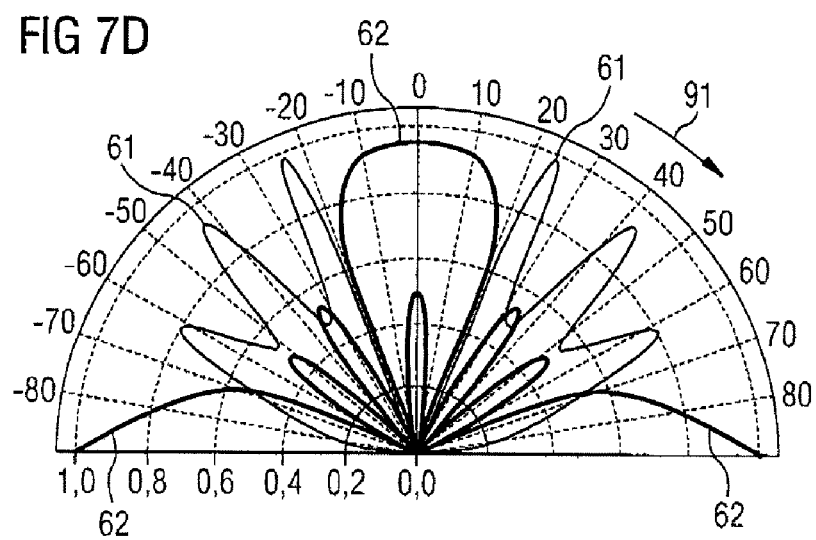

FIGS. 7C and 7D relate to a second filter element 7, which corresponds to the layer construction of the first filter element 6 from FIGS. 7A and 7B, wherein the design wavelength $\lambda_D$=429 nm was chosen for the second filter element 7. As a result, the second filter element 7 has a low transmissivity 61 of approximately 5% and a high reflectivity 62 of approximately 95% for the average wavelength of the coherent first electromagnetic radiation 51 parallel to the emission direction. For angles 91 greater than a limiting angle of approximately 20° and less than approximately −20°, by contrast, the second filter element 7 has a high transmissivity 61, such that incoherent second electromagnetic radiation 52 incident on the rear side 13 of the semiconductor layer sequence at such an angle can be transmitted by the second filter element 7 and can be removed from the semiconductor layer sequence 10 and, consequently, can no longer be emitted in the emission direction via the radiation coupling-out area 12.

The Bragg mirror for the second filter element 7 is embodied such that the first wavelength range of the coherent first electromagnetic radiation 51 is close to the long-wave edge of the global primary maximum of the reflectivity 62, in particular within the long-wave 30% of the range covered by the global primary maximum.

By virtue of the fact that, parallel to the emission direction, that is to say at an angle of 0°, the reflectivity 62 of the second filter element 7 is lower for wavelengths greater than the average wavelength of the coherent first electromagnetic radiation 51 and is virtually equal to the reflectivity at the average wavelength for wavelengths lower than the average wavelength of the coherent first electromagnetic radiation 51, a wavelength stabilization of the coherent first electromagnetic radiation 51 can also be made possible by the second filter element 7.

The filter structure 5 formed from the filter elements 6 and 7 in accordance with FIGS. 7A to 7D thus enables a reduction of the incoherent second electromagnetic radiation 52 emitted in the emission direction via the radiation coupling-out area and also, at the same time, a wavelength stabilization of the first wavelength range of the coherent first electromagnetic radiation 51. The wavelength stabilization can therefore also enable an improvement in the color rendering of the laser light source and simplify the color balancing of a plurality of laser light sources.

As an alternative to the second filter element 7 described in conjunction with FIGS. 7C and 7D, said second filter element can also have, for example, eight layer pairs having alternating refractive indices of 1.5 and 2.1. It is thereby possible to achieve a similar wavelength dependence and angle dependence of the reflectivity 62 and of the transmissivity 61. Furthermore, the layer stack of the Bragg mirror can also have, instead of the layer pairs having two layers, for example, layer multiplets each having three or more layers having different refractive indices.

FIGS. 8A and 8B relate to a further first filter element 6 having a Bragg mirror. By changing the number of layer pairs and/or changing the difference in refractive index between the layers of the layer pairs, the wavelength- and angle-dependent transmissivity 61 and reflectivity 62 can be adapted further. The Bragg mirror having the transmissivities 61 and reflectivities 62 in FIGS. 8A and 8B has approximately 20 layer pairs having refractive indices of 1.5 and 2.1, as a result of which the limiting angle can be reduced to approximately 15°, such that incoherent second electromagnetic radiation 52 at an angle greater than the limiting angle experiences a reflectivity of more than 90%. As a result, the incoherent second electromagnetic radiation 52, in a large angle range, cannot be emitted by the radiation coupling-out area.

Figure 9A:
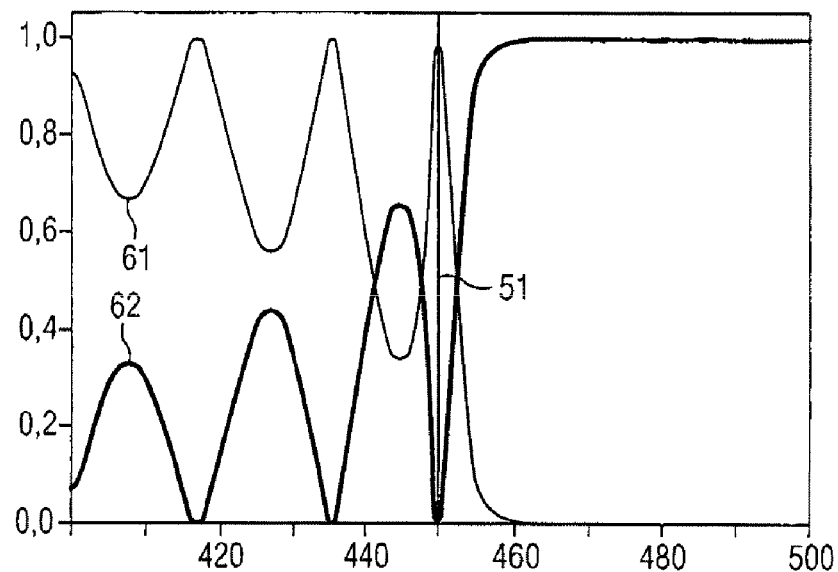
Figure 9B:
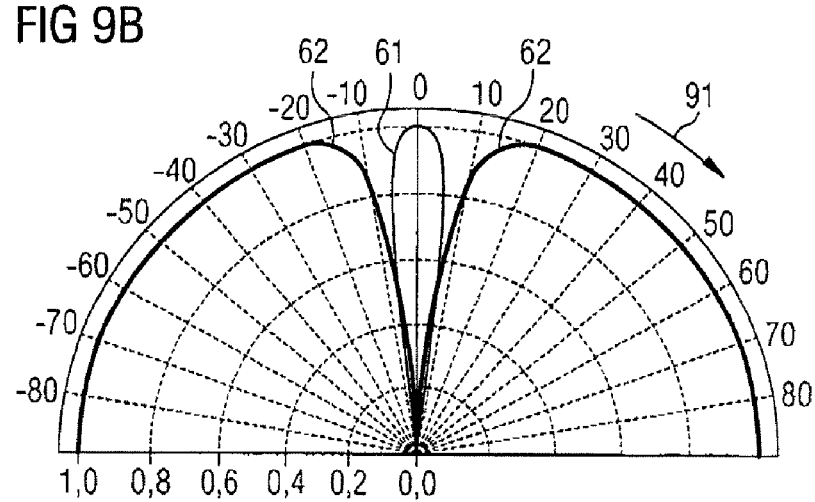

FIGS. 9A and 9B relate to a further first filter element 6 having a Bragg mirror having 15 layer pairs and refractive indices of the first and second layers of the layer pairs of 1.5 and 2.1. In this case, a design wavelength of 505.4 nm was chosen for the thickness of the layers. The Bragg mirror embodied in this way has a transmissivity 61 of virtually 100% in the emission direction for the average wavelength of the coherent first electromagnetic radiation 51, whereas the transmissivity falls very rapidly for emission angles 91 that deviate from the emission direction and for wavelengths that deviate from the average wavelength, and the reflectivity 62 rises correspondingly. In particular, the first local maximum of the transmissivity 61 on the short-wave side of the global maximum corresponds to the first wavelength range of the coherent first electromagnetic radiation 51.

Figure 10:
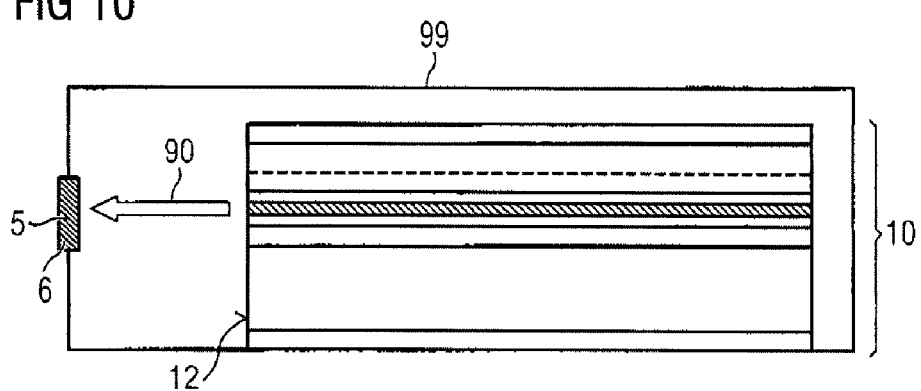
FIGS. 10 to 17 show schematic illustrations of laser light sources in accordance with further exemplary embodiments.

The Bragg mirror in accordance with FIGS. 9A and 9B is suitable, in particular, for a first filter element 6 arranged separately with respect to the semiconductor layer sequence 10. By way of example, this can involve an antireflection-coated window of a housing 99, in which the semiconductor layer sequence 10 is arranged, as is shown in FIG. 10. In this case, the filter structure 5 can comprise just the first filter element as housing window, as in the exemplary embodiment shown. As an alternative or in addition 13, the filter structure 5 can have further first, second and third filter elements 6, 7 and 8 in accordance with the previous exemplary embodiments as separate components or layers or components or layers applied directly to the semiconductor layer sequence 10.

Figure 11:
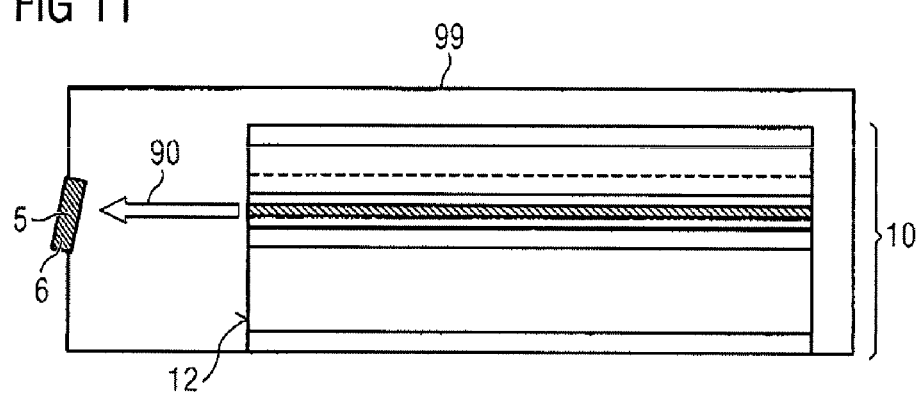

In FIG. 11, the filter structure 5 embodied as a housing window of a housing 99 is a first filter element 6 tilted with respect to the emission direction 90. Such tilting, for instance by an angle of less than or equal to 10°, can prevent electromagnetic radiation reflected from the first filter element 6 from returning into the semiconductor layer sequence 10, as a result of which the stability of the emission of the coherent first electromagnetic radiation 51 can be increased.

As an alternative or in addition to the filter elements of the filter structures 5 described previously, a filter structure 5 can have a fourth filter element 9 in accordance with the following exemplary embodiments.

Figure 12A:
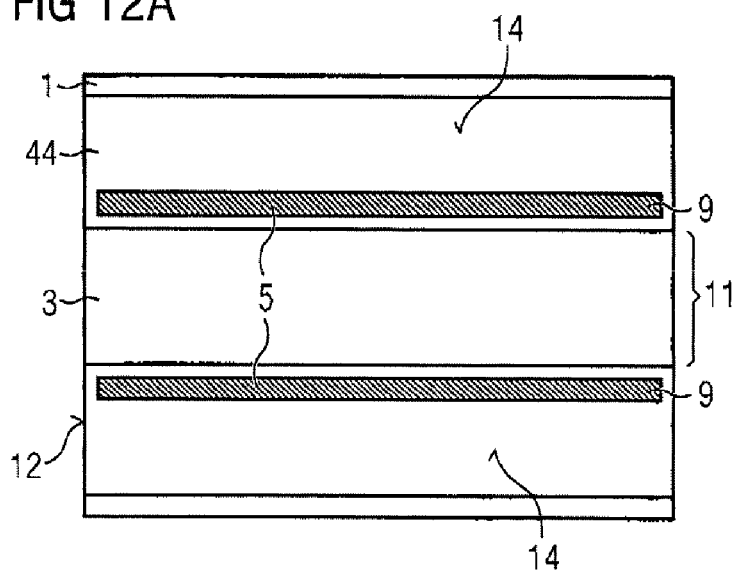
Figure 12B:
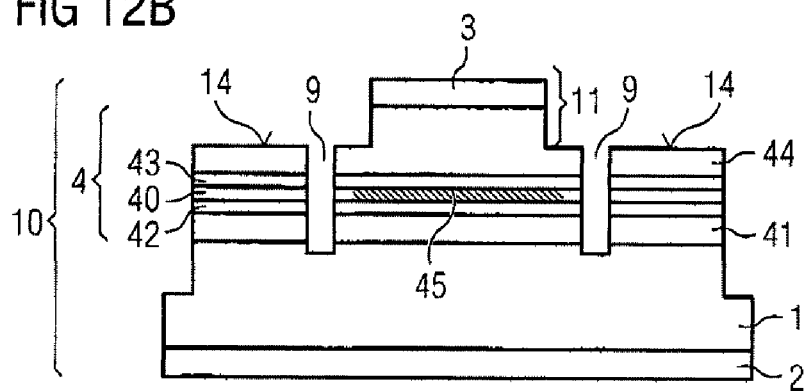

FIGS. 12A and 12B show an exemplary embodiment of a laser light source in a plan view in accordance with FIG. 1C and a sectional view in accordance with FIG. 1B. The filter structure 5 has a surface structure as fourth filter element 9 in the form of two trenches running parallel to the ridge structure 11. In this case, the surface structure is applied in the surface 14 of the semiconductor layer sequence 10 that is remote from the substrate 1, in a manner laterally or offset laterally with respect to the active region 45. The trenches are arranged at a distance of approximately 1 to 4 µm from the ridge structure 11 and extend through the functional layers 4 right into the substrate 1. It is thereby possible to prevent wave guiding of incoherent second electromagnetic radiation from the active region to the side areas of the semiconductor layer sequence 10 in the direction of the extension plane of the functional layers. In particular, the areas of the trenches can be coated with an absorbent, non-transparent material such as, for instance, chromium and/or germanium or the trenches can be filled with an absorbent, non-transparent material.

The trenches in the exemplary embodiment shown run over virtually the entire length of the semiconductor layer sequence 10. As an alternative, the trenches can also run in only a partial region of the semiconductor layer sequence 10.

In the exemplary embodiment shown, the side areas of the trenches are formed perpendicularly to the extension direction of the semiconductor layer sequence. Furthermore, the side areas of the trenches can be beveled and form an angle of greater than 0° and less than or equal to 45° with the growth direction of the semiconductor layer sequence 10. The trenches can thus have a U-shaped or a V-shaped cross section or a combination thereof. Beveled side areas can make it possible that at least part of the incoherent second electromagnetic radiation 52 from the active layer 40 which propagates along the extension plane of the semiconductor layer sequence 10 can be reflected in the direction of the substrate 1. In conjunction with such beveled trenches, an absorbent or roughened layer in accordance with the exemplary embodiments in FIGS. 16 and 17 can prevent or at least reduce the further propagation of incoherent second electromagnetic radiation 52 in the semiconductor layer sequence 10 and therefore also emission via the radiation coupling-out area 12 in the emission direction. Furthermore, the substrate 1 can also be embodied as non-transparent and at least partly absorbent.

The trenches can be producible by etching, for example. In order to avoid possible degradation of the active region, as an alternative to the exemplary embodiment shown, it can also be advantageous if etching is only effected precisely to a depth such that wave guiding between the waveguide layers 42 and 43 is no longer possible, but the active layer 40 is if possible not etched through.

Figure 13:
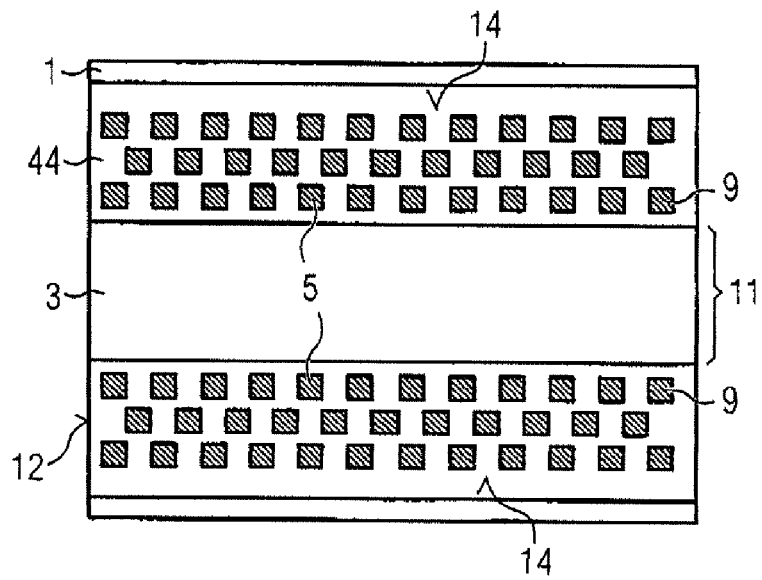

FIG. 13 shows a laser light source having a filter structure 5 having, as fourth filter element 9, a plurality of regular arrangements—running parallel to the ridge structure 11—of depressions instead of the trenches in the previous exemplary embodiment. In this case, the depressions have diameters and distances from one another which are less than or equal to the second wavelength range of the incoherent second electromagnetic radiation 52. As a result, the fourth filter element 9 can act as a photonic crystal along the extension plane of the semiconductor layer sequence 10. The depressions of the fourth filter element 9 have square cross sections in the exemplary embodiment shown. As an alternative or in addition, depressions can also have, for example, circular, elliptical, rectangular or hexagonal cross sections. The depressions can furthermore have beveled side areas and can become smaller with regard to their cross-sectional area in the direction into the semiconductor layer sequence 10. As an alternative or in addition, the fourth filter element 9 can also have a plurality of trenches.

Figure 14:
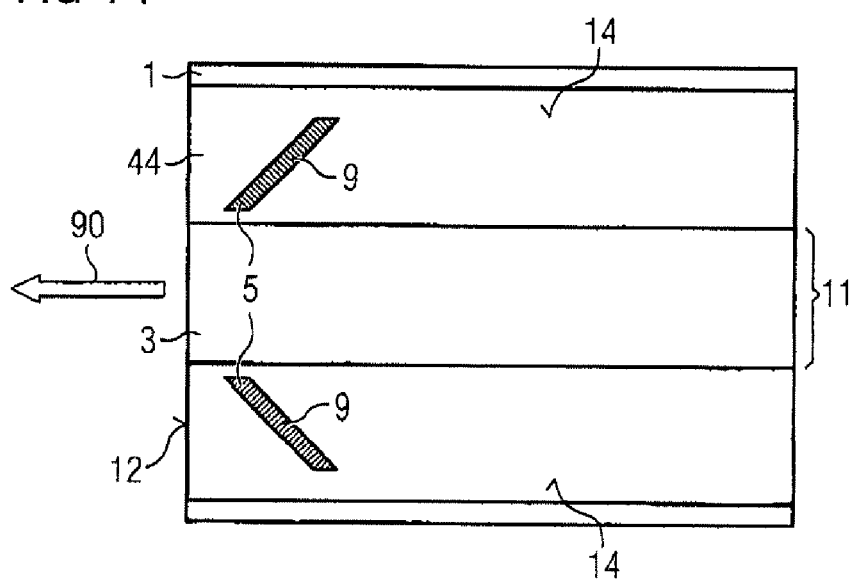

In the exemplary embodiment in accordance with FIG. 14, the filter structure 5 has a fourth filter element 9 in the form of trenches running at an angle of approximately 45° with respect to the emission direction 90. The side walls of the trenches can once again form an angle of 0° to 45° with the growth direction of the semiconductor layer sequence 10 and can be coated with a non-transparent, absorbent material, for example. The distance from the ridge structure 11 is less than 4 µm. The fourth filter element 9 shown in FIG. 14 can effectively reduce the coupling-out of incoherent second electromagnetic radiation 52 from the radiation coupling-out area.

Figure 15A:
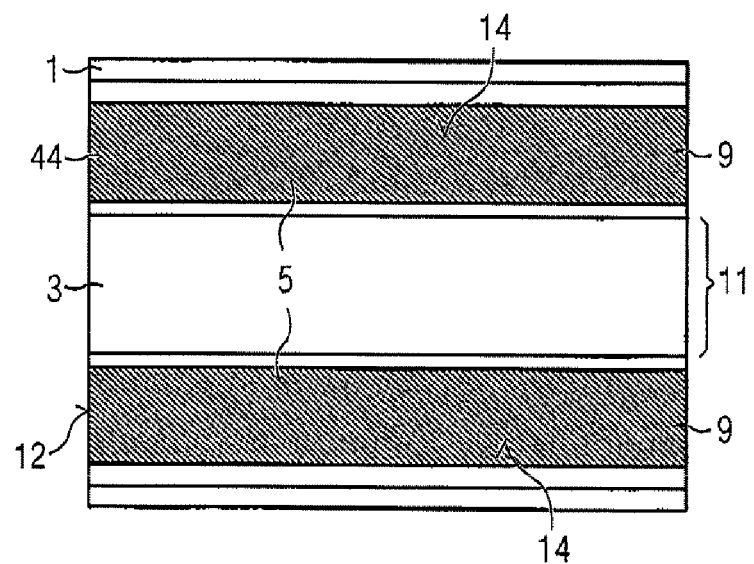
Figure 15B:
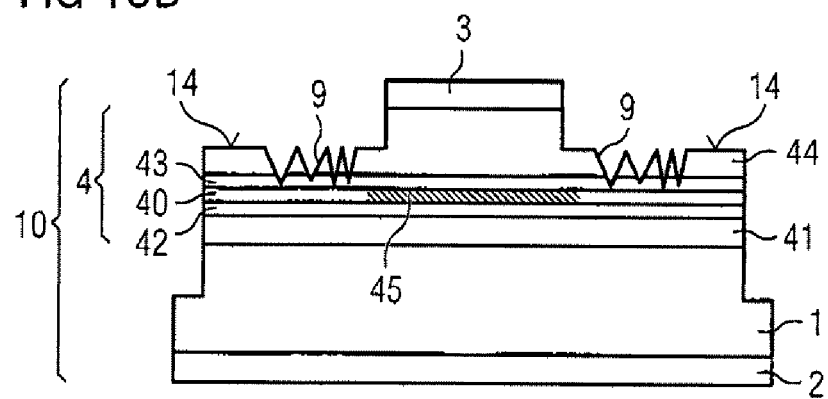

FIGS. 15A and 15B show a fourth filter element 9 having a surface structure in the form of a roughening of the surface 14. In this case, the roughening has an average periodicity of approximately one tenth of the average wavelength of the second wavelength range of the incoherent second electromagnetic radiation 52. In this case, the roughening does not extend directly as far as the ridge structure 11, but rather is spaced apart a few micrometers from the latter. In this case, the roughening, which is producible by wet- or dry-chemical etching methods, extends right into the upper waveguide layer 43, without the active layer 40 being etched through, in order to avoid degradation of the active region. As described in the general part, a fourth filter element 9 of this type can also reduce or prevent the propagation of the incoherent second electromagnetic radiation 52 in the direction of the extension plane of the semiconductor layer sequence 10.

The fourth filter elements 9 shown in FIGS. 12A to 15B can alternatively or additionally also be arranged on that surface of the substrate 1 or of the cladding layer 41 which lies opposite the active region.

Figure 16:
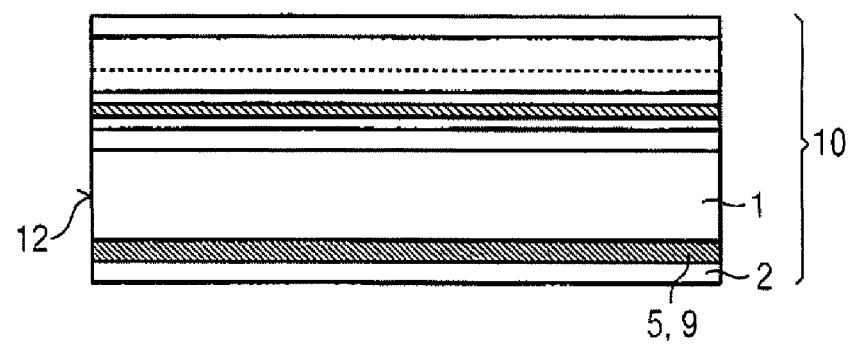
Figure 17:
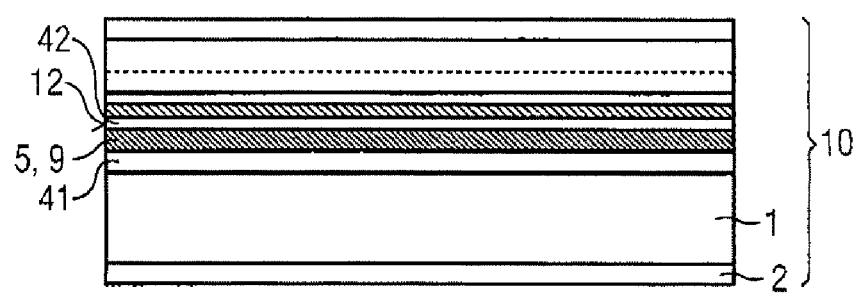

FIGS. 16 and 17 show further exemplary embodiments of fourth filter elements 9 having roughenings and/or a layer comprising non-transparent material at interfaces of layers of the layer sequence 10.

FIG. 16 shows by way of example a fourth filter element 9 having a non-transparent layer, which comprises Cr and/or Ti, between the substrate 1 and the lower electrode 2. As an alternative or in addition, the electrode 2 can also comprise such a layer and therefore be embodied as non-transparent. As an alternative or in addition, the fourth filter element 9 can also have a roughening of a surface of the electrode 2 and/or of the substrate 1.

FIG. 17 shows a non-transparent layer as fourth filter element 9 between the cladding layer 41 and the waveguide layer 42. For this purpose, the non-transparent layer of the fourth filter element 9 comprises a semiconductor material that is absorbent for the incoherent second electromagnetic radiation 52.

The fourth filter elements 9 shown purely by way of example in FIGS. 16 and 17 are suitable, in particular, for reducing the propagation of the incoherent second electromagnetic radiation 52 within the semiconductor layer sequence 10 and, consequently, also for reducing or preventing emission of the incoherent second electromagnetic radiation 52 in the emission direction from the radiation coupling-out area 12.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A laser light source, comprising
a semiconductor layer sequence having an active region and a radiation coupling out area having a first partial region and a second partial region different than the first partial region, and
a filter structure,
wherein
the active region generates, during operation, coherent first electromagnetic radiation having a first wavelength range and incoherent second electromagnetic radiation having a second wavelength range,
the coherent first electromagnetic radiation is emitted by the first partial region along an emission direction,
the incoherent second electromagnetic radiation is emitted by the first partial region and by the second partial region,
the second wavelength range comprises the first wavelength range,
the filter structure at least partly attenuates the incoherent second electromagnetic radiation emitted by the active region along the emission direction,
the filter structure comprises at least one first filter element disposed downstream of the semiconductor layer sequence in the emission direction,
the at least one first filter element has at least one layer comprising a material that is non-transparent to electromagnetic radiation, and
the non-transparent material is at least partly arranged on the second partial region.

2. The laser light source as claimed in claim 1, wherein
the semiconductor layer sequence comprises a transparent substrate and
a surface of the transparent substrate forms a part of the second partial region.

3. The laser light source as claimed in claim 2, wherein the first filter element is applied on the surface of the substrate which forms a part of the second partial region.

4. The laser light source as claimed in claim 3, wherein the first filter element is applied exclusively on the surface of the substrate.

5. The laser light source as claimed in claim 1, wherein the first partial region is free of the first filter element.

6. The laser light source as claimed in claim 1, wherein the first filter element is non-transparent to the incoherent second electromagnetic radiation.

7. The laser light source as claimed in claim 1, wherein the non-transparent material is electrically conductive.

8. The laser light source as claimed in claim 1, wherein the non-transparent material comprises at least one of the materials silicon, gallium, germanium, aluminum, chromium and titanium.

9. The laser light source as claimed in claim 1, wherein the entire second partial region, via which the incoherent second electromagnetic radiation is emitted, is covered with the non-transparent material.

10. The laser light source as claimed in claim 1, wherein
the at least one layer is embodied as a pinhole diaphragm having an opening, and
the opening is arranged above the first partial region.

11. The laser light source as claimed in claim 1, wherein the first filter element has a transparent metal oxide or transparent metal nitride or transparent metal oxynitride layer above the first partial region.

* * * * *